US011205486B2

(12) United States Patent
Choi et al.

(10) Patent No.: US 11,205,486 B2
(45) Date of Patent: Dec. 21, 2021

(54) VOLTAGE GENERATOR AND MEMORY DEVICE HAVING THE VOLTAGE GENERATOR

(71) Applicant: SK hynix Inc., Icheon-si (KR)

(72) Inventors: Won Jae Choi, Icheon-si (KR); Hyun Chul Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/064,261

(22) Filed: Oct. 6, 2020

(65) Prior Publication Data

US 2021/0366555 A1   Nov. 25, 2021

(30) Foreign Application Priority Data

May 19, 2020  (KR) .................. 10-2020-0059832

(51) Int. Cl.
| | |
|---|---|
| *G11C 16/30* | (2006.01) |
| *G11C 16/14* | (2006.01) |
| *G11C 16/26* | (2006.01) |
| *G11C 16/24* | (2006.01) |
| *G11C 16/32* | (2006.01) |
| *G11C 16/08* | (2006.01) |

(52) U.S. Cl.
CPC .............. *G11C 16/14* (2013.01); *G11C 16/08* (2013.01); *G11C 16/24* (2013.01); *G11C 16/26* (2013.01); *G11C 16/30* (2013.01); *G11C 16/32* (2013.01)

(58) Field of Classification Search
CPC ......... G11C 16/14; G11C 16/24; G11C 16/32; G11C 16/30; G11C 16/08; G11C 16/26
See application file for complete search history.

(56) References Cited

U.S. PATENT DOCUMENTS

| | | | | |
|---|---|---|---|---|
| 7,782,120 B2* | 8/2010 | Kim | ................ | G11C 29/12005 327/535 |
| 9,640,272 B2 | 5/2017 | Ito | | |
| 2012/0236672 A1* | 9/2012 | Lee | ......................... | H02M 3/07 365/226 |
| 2017/0309338 A1 | 10/2017 | Shah et al. | | |

FOREIGN PATENT DOCUMENTS

| | | |
|---|---|---|
| KR | 1020060085579 A | 7/2006 |
| KR | 1020070114507 A | 12/2007 |
| KR | 100794659 B1 | 1/2008 |
| KR | 100890017 B1 | 3/2009 |
| KR | 1020110031907 A | 3/2011 |
| KR | 1020170137590 A | 12/2017 |

OTHER PUBLICATIONS

Mario Sako et al., A Low-Power 64Gb MLC NAND-Flash Memory in 15nm CMOS Technology, Feb. 24, 2015, pp. 128-130, ISSCC 2015 / Session 7 / Non-Volatile Memory Solutions / 7.1, 2015 IEEE International Solid-State Circuits Conference, San Francisco, CA, USA.

\* cited by examiner

*Primary Examiner* — Jay W. Radke
(74) *Attorney, Agent, or Firm* — William Park & Associates Ltd.

(57) ABSTRACT

The present technology includes a voltage generator and a memory device including the voltage generator. The voltage generator includes an operation code determiner configured to output a clock control code including the number of planes in response to an operation code, a clock group configured to simultaneously generate clocks having different periods according to the clock control code, and a pump group configured to perform a pumping operation according to the clocks and output operation voltages.

20 Claims, 22 Drawing Sheets

VOLTAGE GENERATOR AND MEMORY DEVICE HAVING THE VOLTAGE GENERATOR

CROSS-REFERENCE TO RELATED APPLICATION

The present application claims priority under 35 U.S.C. § 119(a) to Korean patent application number 10-2020-0059832 filed on May 19, 2020, in the Korean Intellectual Property Office, the entire disclosure of which is incorporated by reference herein.

BACKGROUND

1. Technical Field

The present disclosure generally relates to a voltage generator and a memory device including the voltage generator.

2. Related Art

A memory device may include a volatile memory device in which stored data is destroyed when power supply is cut off, and a non-volatile memory device in which stored data is maintained even though the power supply is cut off. The volatile memory device may include a dynamic random-access memory (DRAM) and a static random-access memory (SRAM). The non-volatile memory device may include a read only memory (ROM), a programmable read only memory (PROM), an erasable PROM (EPROM), an electrically EPROM (EEPROM), a NAND FLASH, and the like.

The memory device may include a memory cell array that stores data and peripheral circuits that perform a program, read, or erase operation.

The memory cell array may include one or more planes. The plane may include a plurality of memory blocks, and each of the plurality of memory blocks may include a plurality of memory cells.

The peripheral circuits may include a voltage generator capable of generating and outputting various voltages used in the program, read, or erase operation, and may include a logic circuit capable of controlling the voltage generator according to a command and an address.

The voltage generator may include a plurality of pumps capable of generating a plurality of operation voltages having various levels. Since pumps generate the operation voltages in response to a clock having a constant period regardless of an operation performed in the memory device, current consumption may increase even in an operation that does not require high performance.

SUMMARY

A voltage generator according to an embodiment of the present disclosure may include an operation code determiner configured to output a clock control code including the number of planes in response to an operation code, a clock group configured to simultaneously generate clocks having different periods according to the clock control code, and a pump group configured to perform a pumping operation according to the clocks and output operation voltages.

A memory device according to an embodiment of the present disclosure may include a memory cell array including one or more planes including a plurality of memory blocks, a logic circuit configured to output an operation code for generating operation voltages required for an operation to be performed in a selected memory block among the memory blocks according to a command and an address, a voltage generator configured to determine a number of the planes on which the operation is to be performed according to the address included in the operation code, and adjust a driving force according to the number of the planes to output the operation voltages, and a row decoder configured to transfer the operation voltages to a selected memory block among the memory blocks.

A voltage generator according to an embodiment of the present disclosure may include an operation code determiner configured to output a clock control code including operation information in response to an operation code, a clock group configured to simultaneously generate clocks having different periods according to the clock control code, and a pump group configured to perform a pumping operation according to the clocks and output operation voltages.

DETAILED DESCRIPTION

Figure 1:
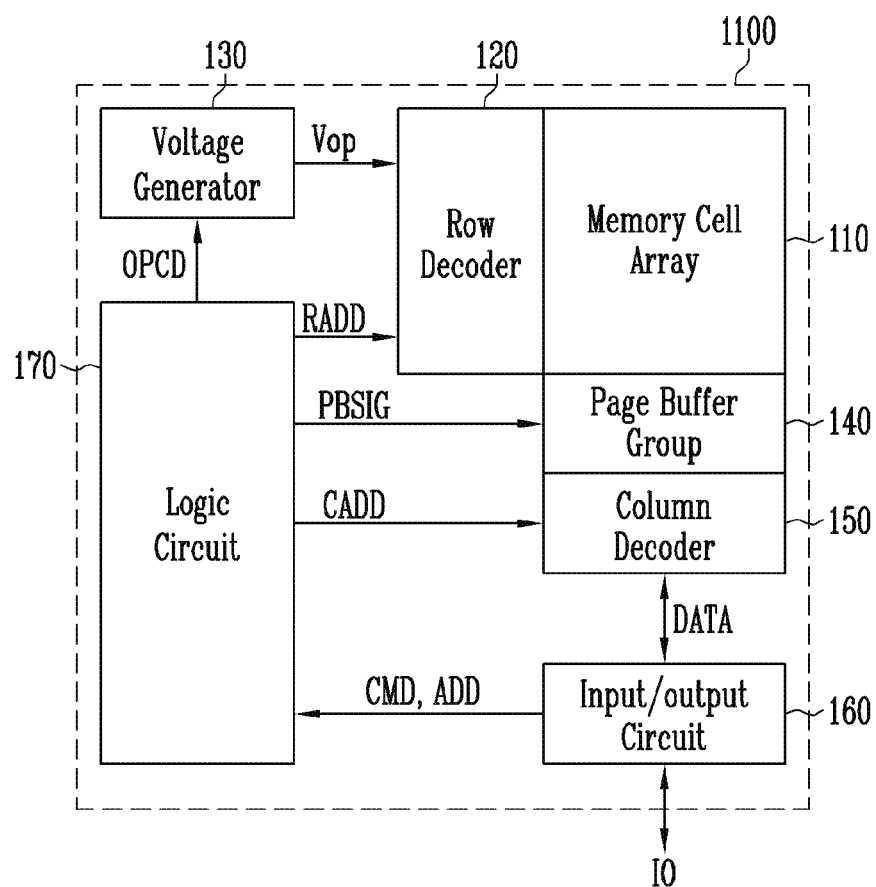
FIG. 1 is a diagram for describing a memory device according to an embodiment of the present disclosure.

FIG. 1 is a diagram for describing a memory device according to an embodiment of the present disclosure.

Referring to FIG. 1, the memory device 1100 may include a memory cell array 110 in which data is stored, and peripheral circuits 120 to 170 capable of performing a program, read, or erase operation.

The memory cell array 110 may include a plurality of memory blocks in which data is stored. Each of the memory blocks may include a plurality of memory cells, and the memory cells may be implemented in a two-dimensional structure in which the memory cells are arranged in parallel to a substrate or a three-dimensional structure in which the memory cells are stacked vertically on the substrate.

The peripheral circuits 120 to 170 may include a row decoder 120, a voltage generator 130, a page buffer group 140, a column decoder 150, and an input/output circuit, and a logic circuit 170.

The row decoder 120 may select one memory block among the memory blocks included in the memory cell array 110 according to a row address RADD, and transmit operation voltages Vop to the selected memory block.

The voltage generator 130 may generate and output the operation voltages Vop required for various operations in response to an operation code OPCD. For example, the voltage generator 130 may generate and output a program voltage, a read voltage, an erase voltage, a pass voltage, a verify voltage, a negative voltage, and the like. The voltage generator 130 according to an embodiment of the present disclosure may include a plurality of pumps capable of generating various operation voltages Vop, and may adjust a period (frequency) of clocks driving the pumps differently according to information included in the operation code OPCD. For example, the voltage generator 130 may include a plurality of clock generators and a plurality of pumps. The plurality of clock generators may simultaneously output clocks having various periods by adjusting the period according to the operation code OPCD. The pumps may generate a voltage in response to the clocks output from the clock generators. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

The page buffer group 140 may be connected to the memory cell array 110 through bit lines. For example, the page buffer group 140 may include page buffers connected to each of the bit lines. The page buffers may operate simultaneously in response to page buffer control signals PBSIG, and may temporarily store data during a program or read operation. A verify operation performed during the program operation and a verify operation performed during the erase operation may be performed in the same method as the read operation. The page buffers may sense a voltage of the bit lines that vary according to a threshold voltage of the memory cells during the read operation or the verify operation. That is, according to a result of the sensing operation performed in the page buffers, it may be determined whether the threshold voltages of the memory cells are lower or higher than the read voltage or the verify voltage.

The column decoder 150 may transmit data DATA between the input/output circuit 160 and the page buffer group 140 according to a column address CADD.

The input/output circuit 160 may be connected to an external device through input/output lines IO. The external device may be a controller capable of controlling the memory device 1100. The input/output circuit 160 may input/output a command CMD, an address ADD, and the data DATA through the input/output lines IO. For example, the input/output circuit 160 may transmit the command CMD and the address ADD received from the external device to the logic circuit 170 through the input/output lines IO, and transmit the data DATA received from the external device through the input/output lines IO to the column decoder 150. The input/output circuit 160 may output the data DATA received from the column decoder 150 to the external device through the input/output lines IO.

The logic circuit 170 may output the operation code OPCD, the row address RADD, the page buffer control signals PBSIG, and the column address CADD, in response to the command CMD and the address ADD. For example, the logic circuit 170 may include software that performs an algorithm in response to the command CMD, and hardware configured to output various signals according to the address ADD and the algorithm. For example, the logic circuit 170 may output the operation code OPCD according to the command CMD and the address ADD. The operation code OPCD may include information on various voltages that may be used in various operations, such as operation information and a physical address, and information on a size of a selected plane or a memory block on which an operation is performed. The operation information may include information corresponding to a program, read, or erase operation, and may be determined according to the command. The physical address may be an address of the plane and the memory block selected in the memory cell array 110.

The voltage generator 130 may change the period of the clocks for generating the various voltages according to the information included in the operation code OPCD.

Figure 2:
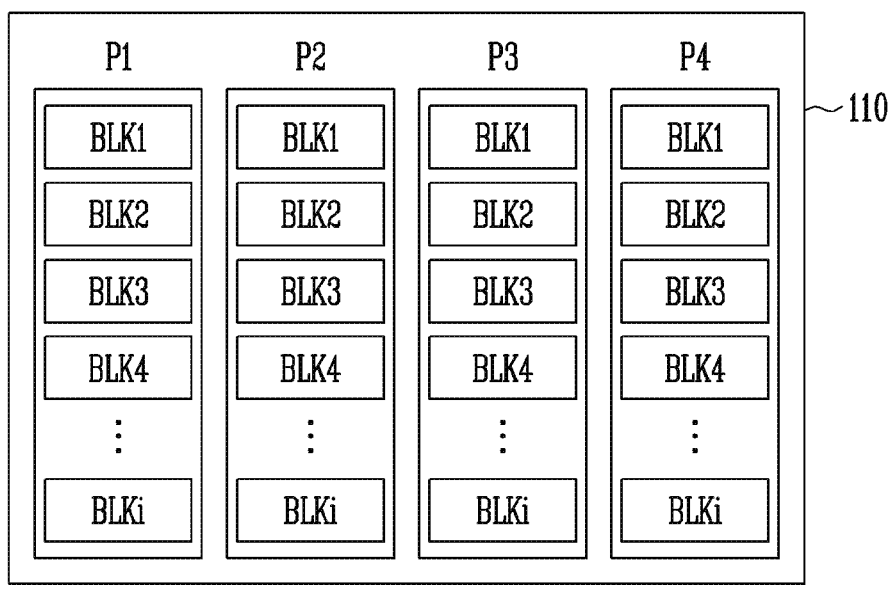
FIG. 2 is a diagram for describing a memory cell array according to an embodiment of the present disclosure.

FIG. 2 is a diagram for describing the memory cell array according to an embodiment of the present disclosure.

Referring to FIG. 2, the memory cell array 110 may be configured as a single plane or multi plane structure. The single plane structure is a structure in which the memory cell array 110 is configured as one plane, and the multi plane structure is a structure in which a plurality of planes are included in the memory cell array 110. FIG. 2 shows a memory cell array 110 having the multi plane structure.

The memory cell array 110 may include first to fourth planes P1 to P4. Different row decoders and different page buffers may be connected to the first to fourth planes P1 to P4. Each of the first to fourth planes P1 to P4 may include a plurality of memory blocks BLK1 to BLKi (i is a positive integer). Different physical addresses may be allocated to the first to fourth planes P1 to P4, and different physical addresses may be allocated to the plurality of memory blocks BLK1 to BLKi.

The first to fourth planes P1 to P4 may be simultaneously selected during the program, read, or erase operation, and the memory blocks selected from the first to fourth planes P1 to P4 may be the same as or different from each other according to the physical address. For example, according to the physical address, the first memory block BLK1 of the first plane P1 may be selected, the third memory block BLK3 of the second plane P2 may be selected, the second memory block BLK2 of the third plane P3 may be selected, and the first memory block BLK1 of the fourth plane P4 may be selected.

For example, during the program operation, when data is input to the page buffers respectively connected to the first to fourth planes P1 to P4, the program operation may be simultaneously performed on the selected memory blocks of the first to fourth planes P1 to P4. During the read operation, the read operation of the selected memory blocks of the first to fourth planes P1 to P4 may be simultaneously performed. During the erase operation, the erase operation of the selected memory blocks of the first to fourth planes P1 to P4 may be simultaneously performed.

Figure 3:
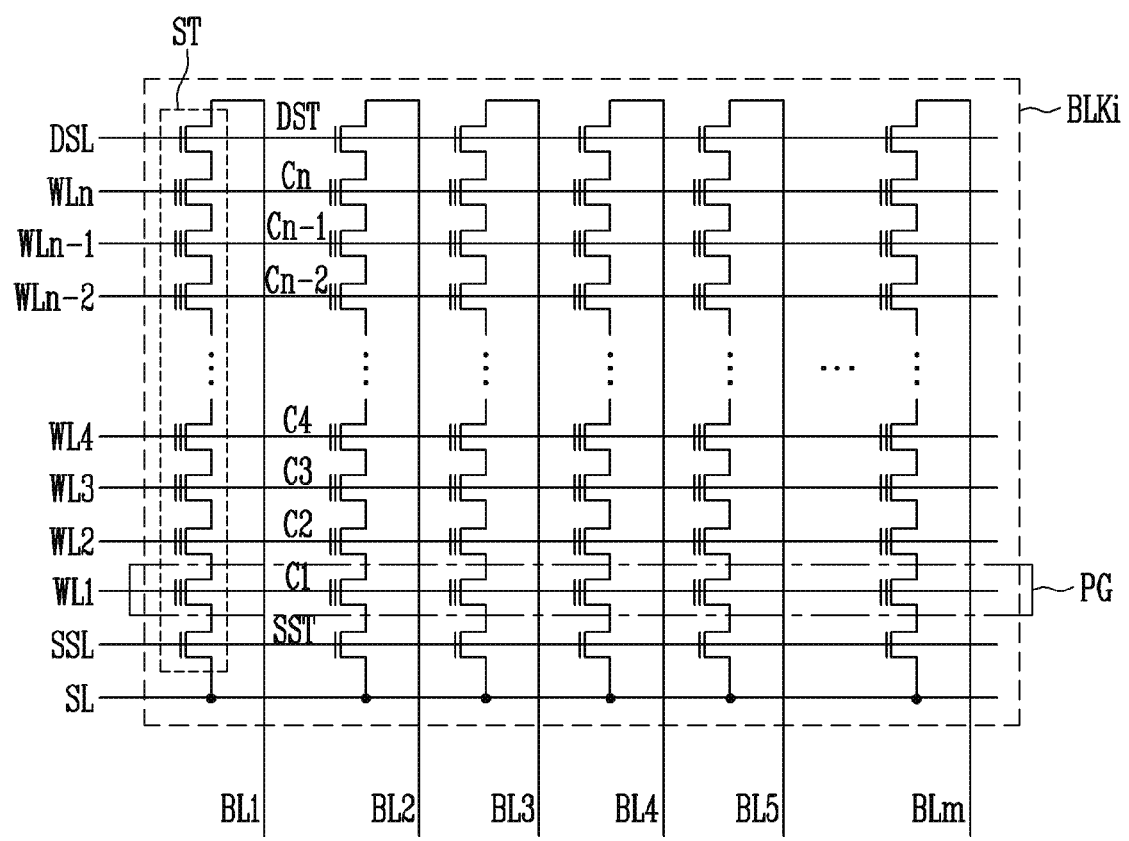
FIG. 3 is a diagram for describing a memory block according to an embodiment of the present disclosure.

FIG. 3 is a diagram for describing the memory block according to an embodiment of the present disclosure.

Referring to FIG. 3, any one memory block BLKi among the plurality of memory blocks BLK1 to BLKi shown in FIG. 2 is shown as an embodiment.

The memory block BLKi may include a plurality of strings ST connected between first to m-th bit lines BL1 to BLm (m is a positive integer) and a source line SL. Each of the strings ST may include a source select transistor SST, the first to n-th memory cells Cl to Cn, and a drain select transistor DST connected in series between the source line SL and the first to m-th bit lines BL1 to BLm.

Since FIG. 3 is a diagram for describing a configuration of the memory block, the number of source select transistors SST, first to n-th memory cells Cl to Cn, and drain select transistors DST is not limited to the number shown in FIG. 3.

Gates of the source select transistors SST connected to different strings ST may be connected to a source select line SSL, gates of the first to n-th memory cells Cl to Cn may be connected to first to n-th word lines WL1 to WLn, and gates of the drain select transistors DST may be connected to a drain select line DSL.

A group of memory cells connected to the same word line and included in different strings ST may configure one page PG. The memory cells may be programmed, read, or verified in a unit of the page PG.

The first to m-th bit lines BL1 to BLm may be connected to the respective page buffers included in the page buffer group 140 of FIG. 1.

Figure 4:
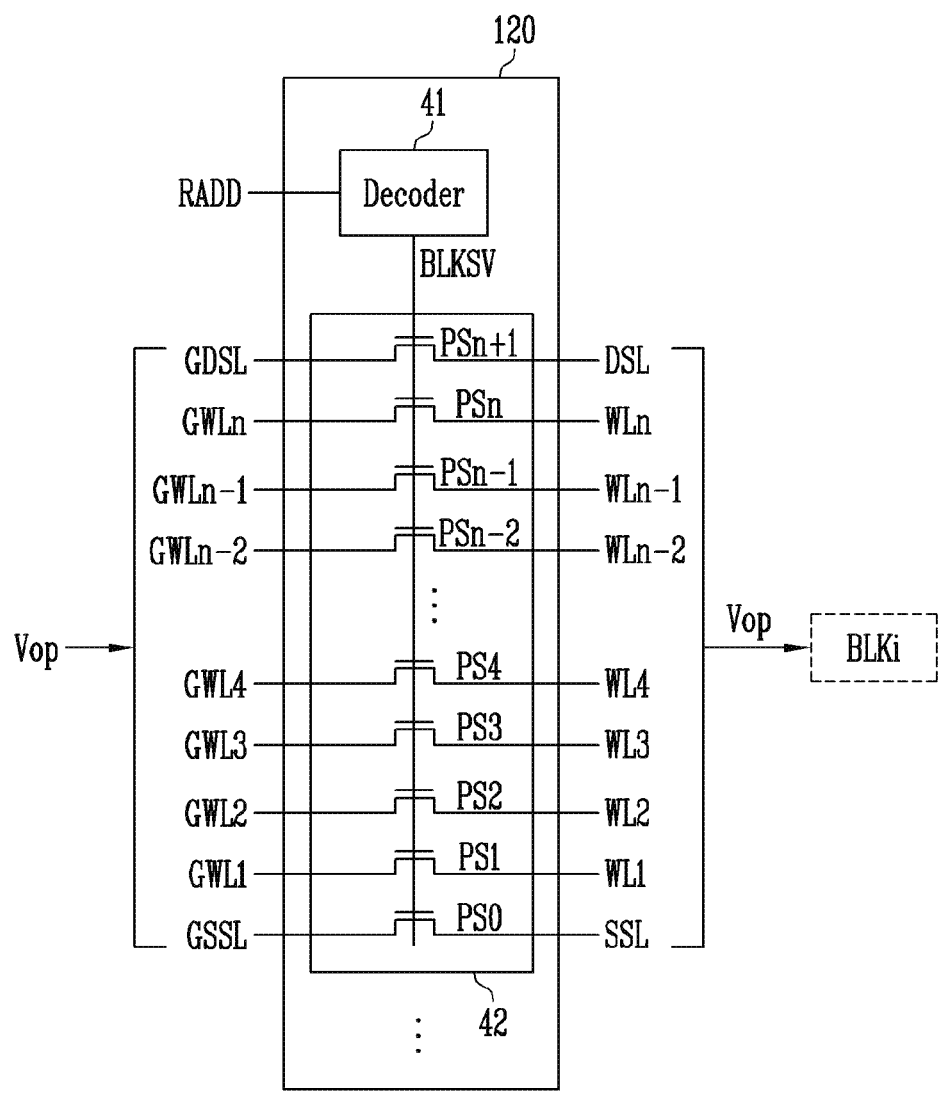
FIG. 4 is a diagram for describing a row decoder according to an embodiment of the present disclosure.

FIG. 4 is a diagram for describing the row decoder according to an embodiment of the present disclosure.

Referring to FIG. 4, the row decoder 120 may include a decoder 41 and a pass switch group 42, and each of the decoder 41 and the pass switch group 42 may be connected to the memory block BLKi. FIG. 4 shows a decoder 41 and a pass switch group 42 connected to any one memory block BLKi.

The decoder 41 may output a block selection voltage BLKSV of a positive voltage, a low voltage, or a ground voltage according to the row address RADD. The pass switch group 42 may include a plurality of pass switches PS0 to PSn+1. For example, when n word lines WL1 to WLn are connected to the memory block BLKi and one source select line SSL and one drain select line DSL are connected to the memory block BLKi, the pass switches PS0 to PSn+1 may be connected to each of the source select line SSL, the first to n-th word lines WL1 to WLn, and the drain select line DSL. The pass switches PS0 to PSn+1 may be implemented as an NMOS transistor, and gates may be commonly connected to an output node of the decoder 41. Therefore, the pass switches PS0 to PSn+1 may operate simultaneously in response to a voltage applied to the output node of the decoder 41. The pass switches PS0 to PSn+1 may be connected to a global source select line GSSL, global word lines GWL1 to GWLn, a global drain select line GDSL, the source select line SSL, and between the first to n-th word lines WL1 to WLn and the drain select line DSL.

The operation voltages Vop output from the voltage generator 130 may be applied to the global source select line GSSL, the global word lines GWL1 to GWLn, and the global drain select line GDSL. When the decoder 41 outputs the block selection voltage BLKSV of the positive voltage, since all of the pass switches PS0 to PSn+1 are turned on, the operation voltages Vop may be transferred to the source select line SSL, the first to n-th word lines WL1 to WLn, and the drain select line DSL.

Figure 5:
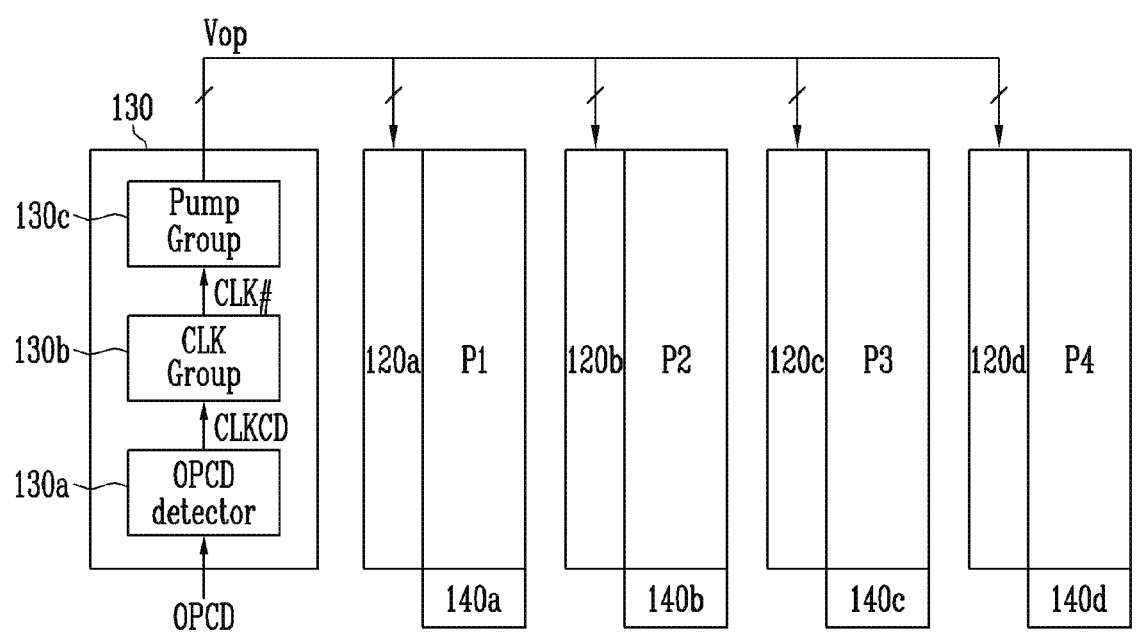
FIG. 5 is a diagram for describing a connection relationship between planes, row decoders, and a voltage generator according to an embodiment of the present disclosure.

FIG. 5 is a diagram for describing a connection relationship between the planes, the row decoders, and the voltage generator according to an embodiment of the present disclosure.

Referring to FIG. 5, first to fourth row decoders 120a to 120d and first to fourth page buffer groups 140a to 140d may be connected to the first to fourth planes P1 to P4, respectively. For example, the first row decoder 120a and the first page buffer group 140a may be connected to the first plane P1, the second row decoder 120b and the second page buffer group 140b may be connected to the second plane P2, the third row decoder 120c and the third page buffer group 140c may be connected to the third plane P3, and the fourth row decoder 120d and the fourth page buffer group 140d may be connected to the fourth plane P4.

The voltage generator 130 may generate the operation voltages Vop having various levels, and transmit the operation voltages Vop to the first to fourth row decoders 120a to 120d. That is, the operation voltages Vop output from the voltage generator 130 may be transferred to a plurality of planes, and thus the program, read, or erase operation may be performed. Therefore, in the present embodiments, driving force of the voltage generator 130 outputting the operation voltages Vop may be adjusted according to the number of operations or selected planes, thereby reducing current consumption.

The voltage generator 130 according to the present embodiments may include an operation code determiner (OPCD detector) 130a, a clock group (CLK group) 130b, and a pump group 130c.

The operation code determiner 130a may output a clock control code CLKCD according to the operation code OPCD. For example, the operation code OPCD may include various information related to the operation, such as the operation information and the physical address. The clock control code CLKCD may include information for adjusting the period of the clock.

The clock group 130b may output a plurality of clocks CLK# having various periods in response to the clock control code CLKCD. For example, the clock group 130b may include a plurality of clock generators, and the clock generators may respectively output clocks CLK# having various periods in response to the clock control code CLKCD.

The pump group 130c may output the operation voltages Vop having various levels in response to the clocks CLK#. For example, the pump group 130c may include a plurality of pumps that output pumped voltages in response to the clocks CLK#. The plurality of pumps may increase a level of an input voltage in stages according to the period of the clocks CLK#, and may output pumping voltages of which the level is increased to a target level as the operation voltages Vop. The driving force that the pumps generate the pumping voltages may be changed according to the period of the clocks CLK#ABC, and current consumption of the pumps may be changed according to the driving force. Since the periods of the clocks CLK# may be different, the driving force of the pumps generating the pumping voltage in response to the clocks CLK# having different periods may be different. For example, as the period of the clock becomes longer, the driving force of the pump may be decreased, and when the driving force is decreased, the current consumption of the pump for generating the pumping voltage may be decreased. Conversely, as the period of the clock becomes shorter, the driving force of the pump may be increased, and when the driving force is increased, the current consumption of the pump for generating the pumping voltage may be increased.

The operation voltages Vop output from the pump group 130c may be transferred to the first to fourth row decoders 120a to 120d, and the operation voltages Vop may be transferred to selected memory blocks included in the first to fourth planes P1 to P4 according to operations of the first to fourth row decoders 120a to 120d and the first to fourth page buffer groups 140a to 140d.

Figure 6:
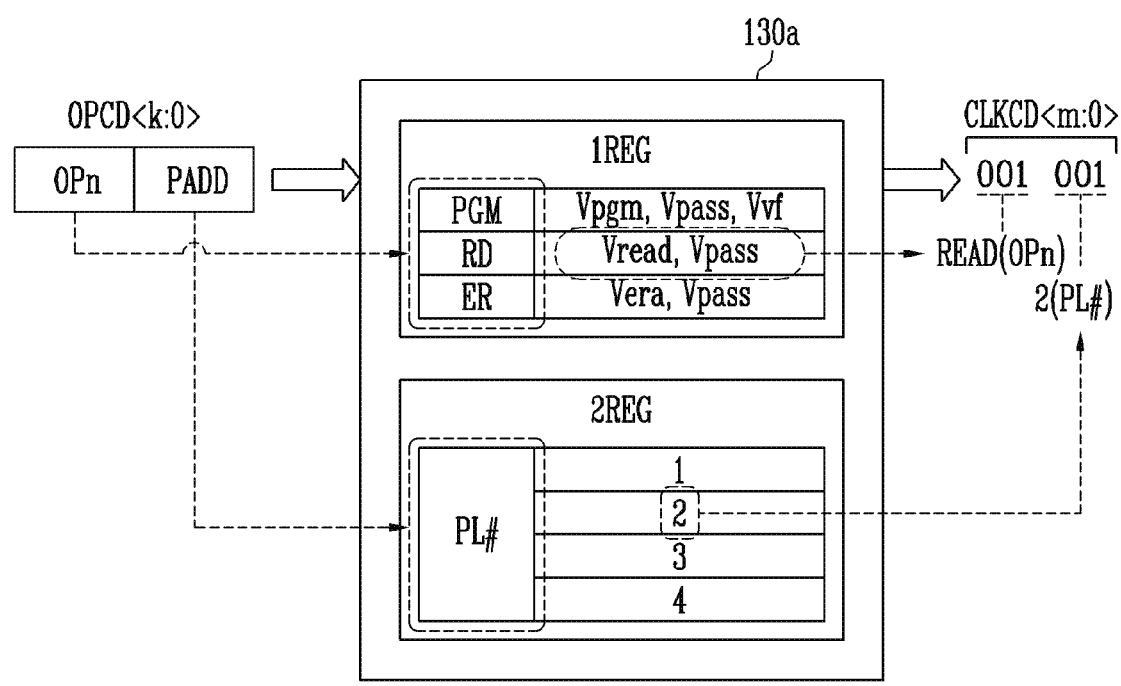
FIG. 6 is a diagram for describing an operation code determiner according to an embodiment of the present disclosure.

FIG. 6 is a diagram for describing the operation code determiner according to an embodiment of the present disclosure.

Referring to FIG. 6, the operation code determiner 130a may output a clock control code CLKCD<m:0> (m is a positive integer) according to an operation code OPCD<k:0> (k is a positive integer). The operation code OPCD<k:0> may include operation information OPn and a physical address PADD. The operation information OPn may be information on a program operation PGM, a read operation RD, or an erase operation ER. The physical address PADD may be the address of the selected plane.

The operation code determiner 130a may include first and second registers 1REG and 2REG that store various information related to the operation performed in the memory device.

The first register 1REG may store voltage information Vpgm, Vpass, Vread, Vera, . . . corresponding to types of voltages that may be used in the respective program operation PGM, the read operation RD, and the erase operation ER. For example, a program voltage Vpgm, a pass voltage Vpass, and a verify voltage Vvf may be used in the program operation PGM, a read voltage Vread and the pass voltage Vpass may be used in the read operation RD, and an erase voltage Ver and the pass voltage Vpass may be used in the erase operation ER. The operation code determiner 130a may select one of the operations stored in the first register 1REG according to the operation information OPn included in the operation code OPCD, and output voltage information used in the selected operation The second register 2REG may store information 1, 2, 3, 4, . . . on the number of planes selected according to the physical address PADD. For example, the operation code determiner 130a may output information on the number of planes in the second register 2REG according to the plane address PAD included in the physical address PADD. For example, when the number of planes selected according to the plane address PAD included in the physical address PADD is determined as two, the operation code determiner 130a may output information on two.

As described above, when the operation code OPCD is input, the operation code determiner 130a may output the information found from the first and second registers 1REG and 2REG as the clock control code CLKCD<m:0>. For example, when the pass voltage Vpass is selected in the first register 1REG and the number of planes is detected as two in the second register 2ERG, the operation code determiner 130a may output the clock control code CLKCD<m:0> including the selected information. The clock control code CLKCD<m:0> may be set to a constant number of bits, and the information selected from the first and second registers 1REG and 2REG may be included in a predetermined address of the clock control code CLKCD<m:0>, respectively. The word "predetermined" as used herein with respect to a parameter, such as a predetermined address, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 7:
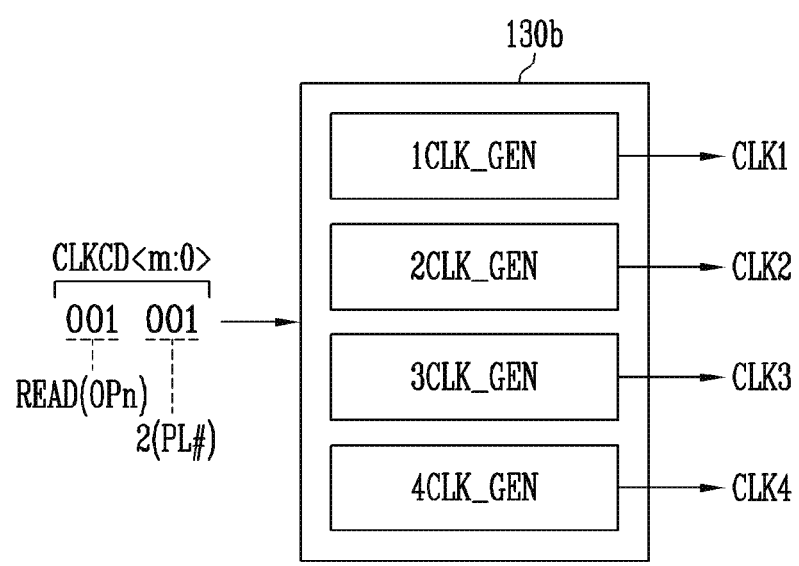
FIG. 7 is a diagram for describing a clock controller according to an embodiment of the present disclosure.
Figure 8:
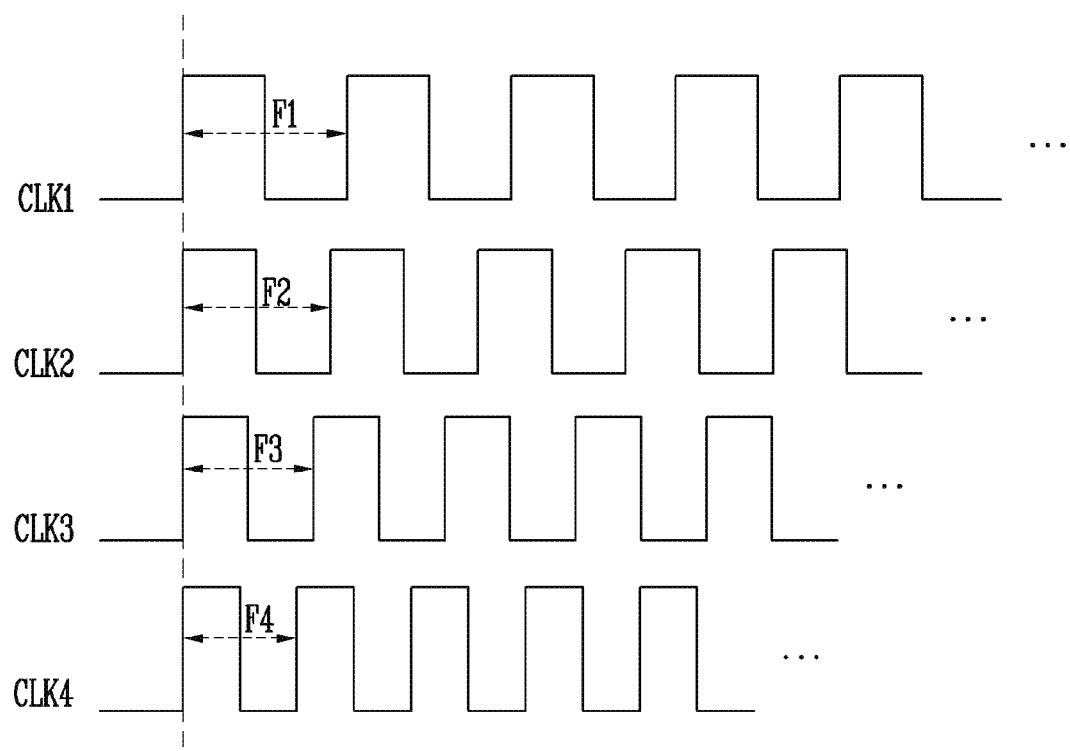
FIG. 8 is a diagram for describing clocks having various periods (frequencies).

FIG. 7 is a diagram for describing a clock controller according to an embodiment of the present disclosure, and FIG. 8 is a diagram for describing clocks having various periods (frequencies).

Referring to FIGS. 7 and 8, the clock group 130b may output a plurality of clocks CLK1 to CLK4 having various periods in response to the clock control code CLKCD<m:0>. For example, the clock group 130b may include first to fourth clock generators 1 to 4CLK_GEN to output the clocks CLK1 to CLK4 having different periods. The first to fourth clock generators 1 to 4 CLK_GEN may output the first to fourth clocks CLK1 to 4 according to the clock control code CLKCD<m:0>. For example, a first For example, a first clock generator 1CLK_GEN may generate a first clock CLK1 having a first period F1, a second clock generator 2CLK_GEN may generate a second clock CLK2 having a second period F2. In the same manner, the third and fourth clock generators 3CLK_GEN and 4CLK_GEN may generate third and fourth clocks CK3 and CLK4 having third and fourth periods F3 and F4, respectively. For example, assuming that the first period F1 is the longest period, the second period F2 may be shorter than the first period F1, the third period F3 may be shorter than the second period F2, and the fourth period F4 may be shorter than the third period F3. In other words, a frequency of the first clock CLK1 is the lowest, and a frequency of the fourth clock CLK4 is the highest. The first to fourth clock generators 1 to 4 CLK_GEN may output the first to fourth clocks CLK1 to CLK4 having different first to fourth periods F1 to F4, respectively. However, some clock generators may output the same clocks to each other according to the clock control code CLKCD<m:0>.

For example, the clock group 130b may select clock generators for outputting a clock among the first to fourth clock generators 1 to 4 CLK_GEN according to the voltage information and the number of planes PL# included in the clock control code CLKCD<m:0>. The selected clock generators may change the period according to the operation information or the number of planes PL# included in the clock control code CLKCD<m:0>, or the operation information and the number of planes PL# in the clock control code CLKCD<m:0>. For example, the clock generator may output a clock having a short period in an operation requiring a high current demand, and may output a clock having a long period as the number of selected planes PL# is smaller. As the period of the clock becomes longer, the driving force of the pump performing the pumping operation according to the clock may be decreased, and thus current consumption of the pump may be decreased.

The first to fourth clock generators 1 to 4 CLK_GEN shown in FIG. 7 are shown to output the first to fourth clocks CLK1 to CLK4, respectively. However, the first to fourth clock generators 1 to 4 CLK_GEN may output clocks having the same or different periods according to the clock control code CLKCD<m:0>. For example, according to the clock control code CLKCD<m:0>, the first clock generator 1CLK_GEN may output the third clock CLK3 and the second clock generator 2CLK_GEN may output the first clock CLK1.

Figure 9:
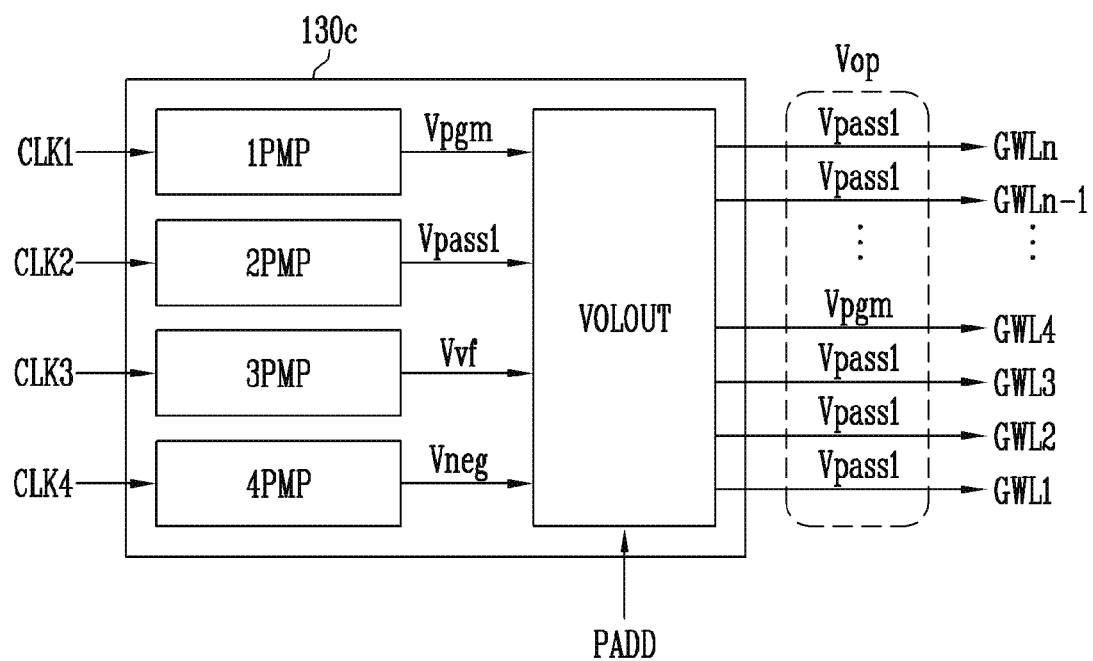
FIG. 9 is a diagram for describing a pump group according to an embodiment of the present disclosure.

FIG. 9 is a diagram for describing the pump group according to an embodiment of the present disclosure.

Referring to FIG. 9, the pump group 130c may include first to fourth pumps 1 to 4PMP for outputting various voltages required for various operations, and a voltage output circuit VOLOUT transmitting the pumped voltages to global word lines GWL. A first pump 1PMP may output the program voltage Vpgm or the erase voltage, the second pump 2PMP may output a first pass voltage Vpass1, the third pump 3PMP may output the verify voltage Vvf or the read voltage, and the fourth pump 4PMP may output a negative voltage Vneg. In addition to the pumps shown in FIG. 9, a plurality of pumps for outputting various voltages may be further included. In the present embodiments, for convenience of description, four pumps are described as an example. The first to fourth pumps 1 to 4 PMP may perform pumping operations in response to the first to fourth clocks CLK1 to 4, respectively, and output voltages having a target level by the pumping operation, respectively. During the program, read, or erase operation, since pass voltages having various levels in addition to the first pass voltage Vpass1 may be output, a plurality of pumps may be further included in the pump group 130c in addition to the first to fourth pumps 1 to 4PMP.

The first pump 1PMP may output the program voltage Vpgm according to the first clock CLK1, the second pump 2PMP may output the first pass voltage Vpass1 according to the second clock CLK2, the third pump 3PMP may output the verify voltage Vvf according to the third clock CLK3. The fourth pump 4PMP may output the negative voltage Vneg according to the fourth clock CLK4.

In FIG. 9, the first to fourth pumps 1 to 4 PMP output the voltages according to the different first to fourth clocks CLK1 to 4, respectively. However, this is an embodiment for describing the disclosure. The first to fourth pumps 1 to 4 PMP may output the voltages according to the same clocks, only some pumps may output the voltages according to the same clocks, and a pump to which a clock is not input may be deactivated. The deactivated pump does not output a voltage.

When the period of the first clock CLK1 is longer than that of the second clock CLK2, driving force of the first pump 1PMP performing the pumping operation according to the first clock CLK1 is lower than driving force of the second pump 2PMP performing the pumping operation according to the second clock CLK2.

When the first to fourth pumps 1 to 4PMP output the program voltage Vpgm, the first pass voltage Vpass1, the verify voltage Vvf, or the negative voltage Vneg, the voltage output circuit VOLOUT may selectively transfer the program voltage Vpgm, the first pass voltage Vpass1, the verify voltage Vvf, and the negative voltage Vneg to the global word lines GWL according to the physical address PADD.

The first to fourth pumps 1 to 4PMP outputting the operation voltages Vop will be described as follows.

Figure 10:
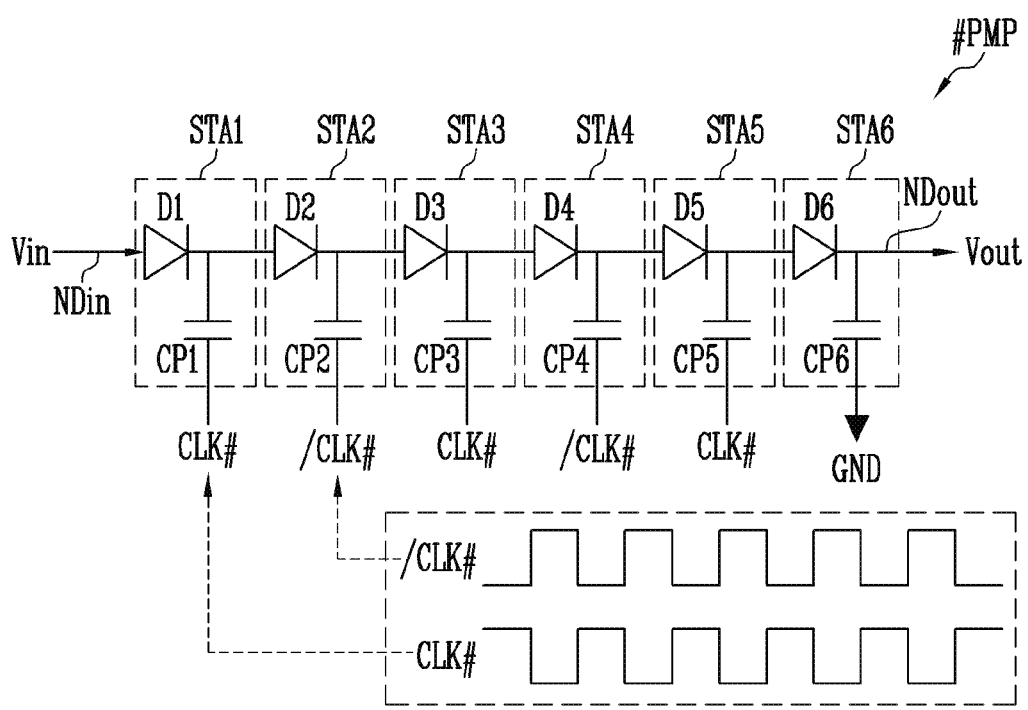
FIG. 10 is a circuit diagram for describing a pump according to an embodiment of the present disclosure.

FIG. 10 is a circuit diagram for describing the pump according to an embodiment of the present disclosure. The pump #PMP shown in FIG. 10 may be any one of the first to fourth pumps 1 to 4PMP shown in FIG. 9.

Referring to FIG. 10, the pump #PMP may include a plurality of stages STA1 to STA6 connected between an input node NDin to which an input voltage Vin is applied and an output node NDout from which an output voltage Vout is output. For example, first to sixth stages STA1 to STA6 may be connected in series between the input node NDin and the output node NDout. Each of the first to sixth stages STA1 to STA6 may include a diode and a capacitor, and may be configured in the same structure. When the first stage STA1 is described as an example, the first stage STA1 may include a first diode D1 and a first capacitor CP1. The input node NDin may be connected to an input terminal of the first diode D1, and an input terminal of a second diode D2 included in the second stage STA2 may be connected to an output terminal of the first diode D1. That is, the first to sixth diodes D1 to D6 included in the first to sixth stages STA1 to STA6 may be connected in series with each other. The first capacitor CP1 included in the first stage STA1 may be connected between the output terminal of the first diode D1 and a node to which the clock CLK# is applied. Second to sixth capacitors CP2 to CP6 included in the second to sixth stages STA2 to STA6 may also be connected to output terminals of the second to sixth diodes D2 to D6. The clocks CLK# may be applied to the first, third, and fifth capacitors CP1, CP3, and CP5, which are odd-numbered capacitors among the first to sixth capacitors CP1 to CP6, and an inverted clock /CLK# may be applied to the second and fourth capacitors CP2 and CP4 which are even-numbered capacitors. The inverted clock /CLK# means a clock of which a phase is opposite to that of the clock CLK#. For example, when the clock CLK# is high, the inverted clock /CLK# may be low. The sixth capacitor CP6 connected to the output node NDout may be connected between the output node NDout and a terminal to which a ground voltage GND is applied.

The pumping operation may be performed in a method in which the clock CLK# and the inverted clock /CLK# are input a plurality of times. For example, when the input voltage Vin is a power voltage VDD, when the clock CLK# is high, a high voltage may be charged in the first capacitor CP1, and the first diode D1 may output the power voltage VDD, which is input to the input terminal, from the output terminal. Accordingly, a voltage higher than the power voltage VDD may be output from the output terminal of the first diode D1 by the voltage charged in the first capacitor CP1. The voltage increased in such a method may be increased in stages through the second to sixth diodes D2 to D6 whenever the phases of the clock CLK# and the inverted clock /CLK# are changed, and the voltage output from the sixth diode D6 may be output through the output node NDout as an output voltage Vout. A level of the output voltage Vout may be adjusted according to the number of stages STA1 to STA6 included in the pump #PMP, and the output voltage Vout output from the pump# PMP may be the various voltages Vpgm, Vpass1, Vvf, or Vneg shown in FIG. 9.

Since the pump #PMP performs the pumping operation according to the input clock CLK# and inverted clock /CLK# to output the output voltage Vout, driving force of the pump #PMP may be changed according to a period of the clock CLK# and the inverting clock /CLK#. For example, as the period of the clock CLK# and the inverted clock /CLK# becomes longer, a time for which the voltage increases in stages from the first diode D1 to the sixth diode D6 becomes longer, and thus the driving force of the pump #PMP may be decreased. Conversely, as the period of the clock CLK# and the inverted clock /CLK# becomes shorter, the time for which the voltage increases in stages from the first diode D1 to the sixth diode D6 becomes shorter, and thus the driving force of the pump #PMP may be increased. When the driving force of the pump #PMP increases, a current amount consumed when performing the pumping operation may increase, and when the driving force decreases, the current amount consumed when performing the pumping operation may decrease.

Figure 11:
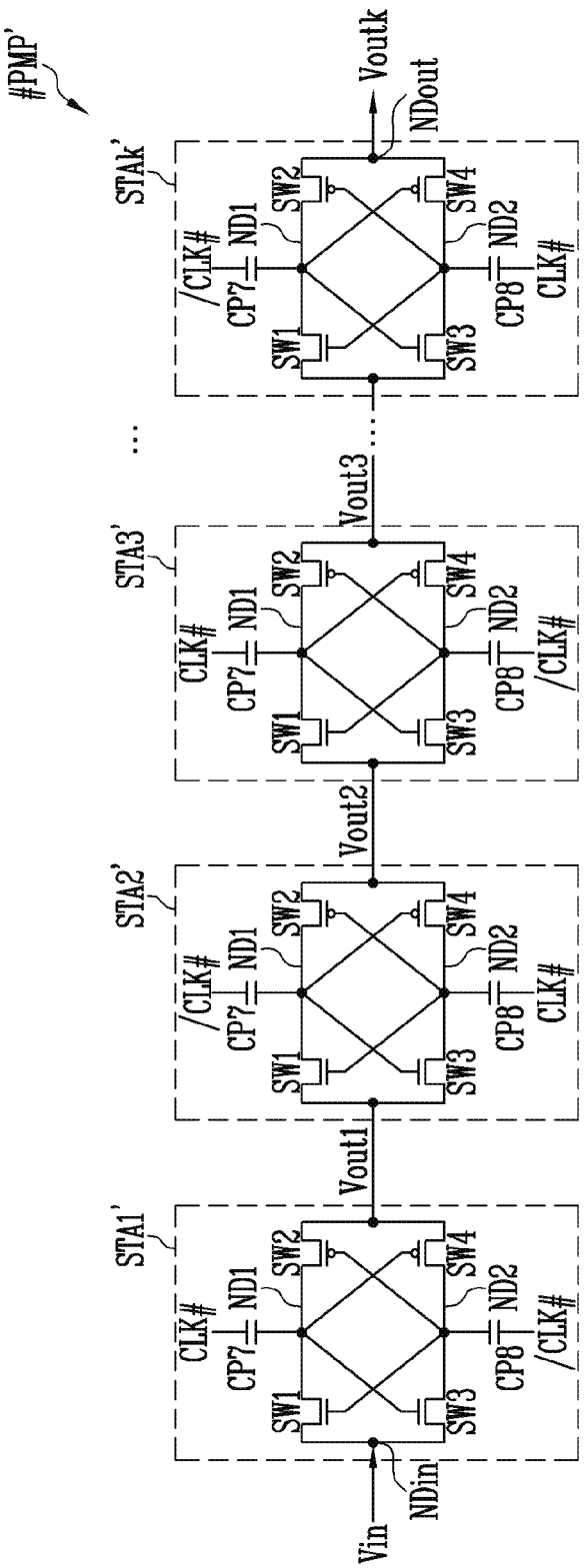
FIG. 11 is a circuit diagram for describing a pump according to another embodiment of the present disclosure.

FIG. 11 is a circuit diagram for describing a pump according to another embodiment of the present disclosure. In an embodiment, the pump #PMP' shown in FIG. 11 may be any one of the first to fourth pumps 1 to 4PMP shown in FIG. 9.

Referring to FIG. 11, the pump #PMP' may include first to k-th stages STA1' to STAk' connected in series with each other between the input node NDin and the output node NDout. Each of the first to k-th stages STA1' to STAk' may perform a pumping operation in response to the clock CLK# and the inverted clock /CLK#.

Since the first to k-th stages STA1' to STAk' may be configured in the same structure, the first stage STA1' is described as an example as follows.

The first stage STA1' may include first and second switches SW1 and SW2 and third and fourth switches SW3 and SW4, which are connected in parallel to each other between the input node NDin and the second stage STA2'. The input voltage Vin supplied to the pump #PMP' may be applied to the input node NDin, and the input voltage Vin may be the power voltage VDD. The first and second switches SW1 and SW2 are connected in series with each other between the input node NDin and the second stage STA2', and the third and fourth switches SW3 and SW4 are connected in series with each other between the input node NDin and the second stage STA2'. The first switch SW1 may be implemented as an NMOS transistor, and the second switch SW2 may be implemented as a PMOS transistor. The third switch SW3 may be implemented as an NMOS transistor, and the fourth switch SW4 may be implemented as a PMOS transistor.

A seventh capacitor CP7 is connected to a first node ND1 between the first and second switches SW1 and SW2, and the clock CLK# is applied to the seventh capacitor CP7. An eighth capacitor CP8 is connected to a second node ND2 between the third and fourth switches SW3 and SW4, and the inverted clock /CLK# is applied to the eighth capacitor CP8.

Gates of the first and second switches SW1 and SW2 may be connected to the second node ND2, and gates of the third and fourth switches SW3 and SW4 may be connected to the first node ND1. Therefore, when the clock CLK# is high and the inverted clock /CLK# is low, since a potential of the first node ND1 becomes high and a potential of the second node ND2 becomes low, the second and third switches SW2 and SW3 are turned on and the first and fourth switches SW1 and SW4 are turned off. When the clock CLK# is low and the inverted clock /CLK# is high, since the potential of the first node ND1 becomes low and the potential of the second node ND2 becomes high, the second and third switches SW2 and SW3 are turned off and the first and fourth switches SW1 and SW4 are turned on. Therefore, the first stage STA1' may perform the pumping operation according to the clock CLK# and the inverted clock /CLK# to output a first output voltage Vont1 higher than the input voltage Vin.

The second stage STA2' may receive the first output voltage Vout1 output from the first stage STA1' as an input voltage and perform a pumping operation according to the inverted clock /CLK# and the clock CLK#. The inverted clock /CLK# and the clock CLK# input to the second stage STA2' may have phases opposite to those of the first stage STA1'. For example, when the clock CLK# is input to the seventh capacitor CP7 of the first stage STA1, the inverted clock /CLK# may be input to the seventh capacitor CP7 of the second stage STA2'. When the inverted clock /CLK# is input to the eighth capacitor CP8 of the first stage STA1, the clock CLK# may be input to the eighth capacitor CP8 of the second stage STA2'.

The second stage STA2' may perform the pumping operation according to the inverted clock /CLK# and the clock CLK# to output a second output voltage Vout2 higher than the first output voltage Vout1.

The third stage STA3' may be configured in the same structure as the first stage STA1', and may output a third output voltage Vout3 higher than the second output voltage Vout2 in response to the clock CLK# and the inverted clock /CLK# input to the first stage STA1'.

Accordingly, the pumping operation may be performed whenever the phases of the clock CLK# and the inverted clock /CLK# input to the pump #PMP are changed, and thus the k-th stage STAk' may output a k-th output voltage Voutk, which is higher than the input voltage Vin applied to the first stage STA1, through the output node NDout.

Since the pump #PMP' shown in FIG. 11 also performs the pumping operation in response to the clock CLK# and the inverted clock /CLK#, driving force may be changed according to the period of the clock CLK#. For example, as the period of the clock CLK# and the inverted clock /CLK# becomes longer, a time for which the output voltage Vout is output becomes longer, and thus the driving force of the pump #PMP' may be decreased. Conversely, as the period of the clock CLK# and the inverted clock /CLK# becomes shorter, the time for which the output voltage Vout is output becomes shorter, and thus the driving force of the pump #PMP' may be increased. When the driving force of the pump #PMP' increases, a current amount consumed when performing the pumping operation may increase, and when the driving force decreases, the current amount consumed when performing the pumping operation may decrease.

Figure 12:
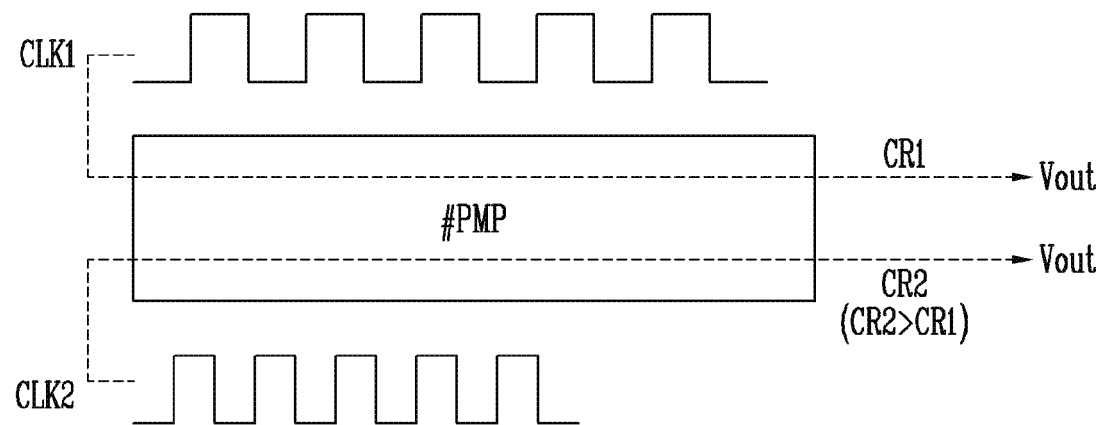
FIG. 12 is a diagram for describing a pump of which current consumption is changed according to a period of a clock.

FIG. 12 is a diagram for describing a pump of which current consumption is changed according to the period of the clock.

Referring to FIG. 12, it is assumed that a current amount consumed when the pump #PMP or for example, pump #PMP', outputs the output voltage Vout in response to a first clock CLK1 is a first current consumption CR1, and a current amount consumed when the pump #PMP (or #PMP') outputs the output voltage Vout in response to a second clock CLK2 is a second current consumption CR2. When a period of the first clock CLK1 is longer than a period of the second clock CLK2, the second current consumption CR2 is greater than the first current consumption CR1. That is, even though the pump #PMP outputs the output voltage Vout having the same level, the consumed current amount may be changed according to the period of the clock.

Figure 13:
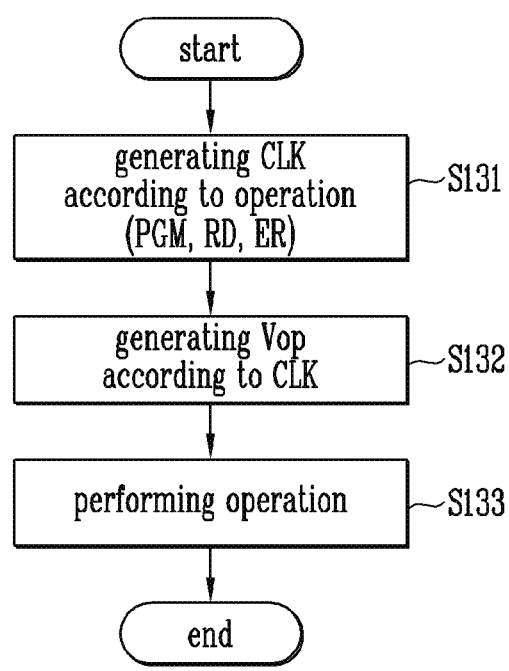
FIG. 13 is a flowchart for describing a voltage generation method according to an embodiment of the present disclosure.

FIG. 13 is a flowchart for describing a voltage generation method according to an embodiment of the present disclosure.

Referring to FIGS. 13 and 1, the voltage generator 130 may generate the clocks CLK having various periods according to an operation (S131). For example, when a program PGM, read RD, or erase ER command is input to the memory device 1100, the logic circuit 170 may generate the operation code OPCD in response to the command. For example, the logic circuit 170 may generate the operation code OPCD including information such as the operation information and the physical address, and may transmit the operation code OPCD to the voltage generator 130. The operation code determiner 130*a* of FIG. 5 included in the voltage generator 130 may output the clock control code CLKCD according to the information included in the operation code OPCD, and the clock group 130*b* of FIG. 5 may output the clocks CLK of which the period is changed according to the clock control code CLKCD. The periods of the clocks CLK may be set differently according to the program PGM, read RD or erase ER operation. For example, the period of the clocks CLK may be set to be longer in the erase ER operation than in the program PGM and read RD operations.

The pump group 130*c* of FIG. 5 may generate the operation voltages Vop having various levels by driving the plurality of pumps according to the clocks CLK having the various periods (S132). As the period of the clocks CLK input to the pumps is longer, the driving force of the pumps is decreased, and thus the consumed current amount may be decreased.

The memory device 1100 may perform a selected operation using the operation voltages Vop (S133). For example, the memory device 1100 may generate operation voltages Vop required for the program operation in response to the program PGM command, and perform the program operation using the operation voltages Vop.

Figure 14:
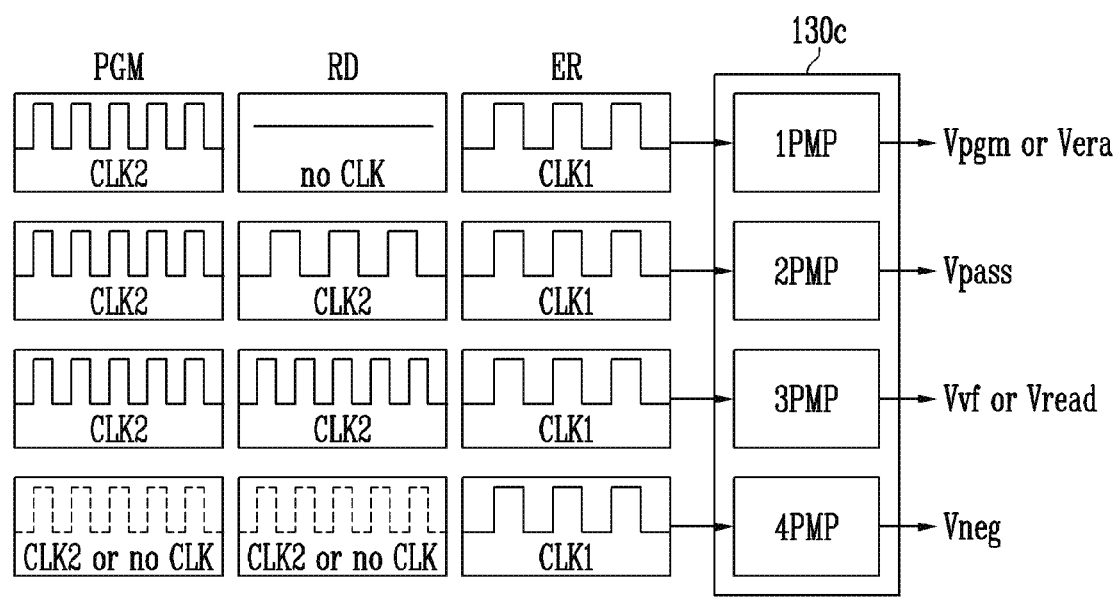
FIG. 14 is a diagram for describing a pump group generating a voltage according to the voltage generation method shown in FIG. 13.

FIG. 14 is a diagram for describing the pump group generating a voltage according to the voltage generation method shown in FIG. 13.

Referring to FIG. 14, the period of the clock may be adjusted according to the operation. For example, the period of the clock may be adjusted according to the current demand required in the operation. Here, the current demand may be the current amount used in each of the program operation PGM, the read operation RD, or the erase operation ER, and may be changed according to an address of each operation. For example, when it is assumed that the current demand required in the program operation PGM and the read operation RD is higher than that of the erase operation ER, the second clock CLK2 of which the period is shorter than that of the erase operation ER may be used in the program operation PGM and the read operation RD, the first clock CLK1 of which the period is longer than that of the program operation PGM or the read operation RD may be used in the erase operation ER. Alternatively, when it is assumed that the current demand required in the erase operation ER is higher than that of the program operation PGM or the read operation RD, the second clock CLK2 of which the period is shorter than that of the program operation PGM or the read operation RD may be used in the erase operation ER, and the first clock CLK1 of which the period is longer than that of the erase operation ER may be used in the program operation PGM or the read operation RD.

For example, when the program operation PGM is performed, the first to fourth pumps 1 to 4PMP may generate the program voltage Vpgm, the pass voltage Vpass, or the verify voltage Vvf in response to the second clock CLK2. It is assumed that the second clock CLK2 has a second period. When the negative voltage Vneg is used during the verify operation performed in the program operation PGM, the fourth pump 4PMP may output the negative voltage Vneg in response to the second clock CLK2. When the negative voltage Vneg is not used, the clock CLK is not applied to the fourth pump 4PMP (no CLK), and thus the fourth pump 4PMP may be deactivated.

When the read operation RD is performed, the second to fourth pumps 2 to 4 PMP may be activated, and the first pump 1PMP may be deactivated. When the first pump 1PMP is set to output the program voltage Vpgm or the erase voltage Vera, the first pump 1PMP may be deactivated when the read operation RD is performed. For example, when the clock CLK is not applied to the first pump 1PMP, the first pump 1PMP may be deactivated. The second pump 2PMP may generate the pass voltage Vpass in response to the second clock CLK2. The third pump 3PMP may generate the read voltage Vread in response to the second clock CLK2. When the negative voltage Vneg is used during the read operation, the fourth pump 4PMP may output the negative voltage Vneg in response to the second clock CLK2. In an operation in which the negative voltage Vneg is not used, the clock CLK might not be applied to the fourth pump 4PMP, and thus the fourth pump 4PMP may be deactivated.

When the erase ER operation is performed, the first to fourth pumps 1 to 4 PMP may generate the erase voltage Ver, the pass voltage Vpass, the verify voltage Vvf, or the negative voltage Vneg in response to the first clock CLK1. For example, the first clocks CLK1 having a first period longer than the second period may be used to decrease current consumption when generating voltages in the erase operation ER.

As described above, the first to fourth pumps 1 to 4PMP may perform the pumping operation in response to the input clocks, and the driving force of the pumps may be changed according to the period of the clocks.

Figure 15:
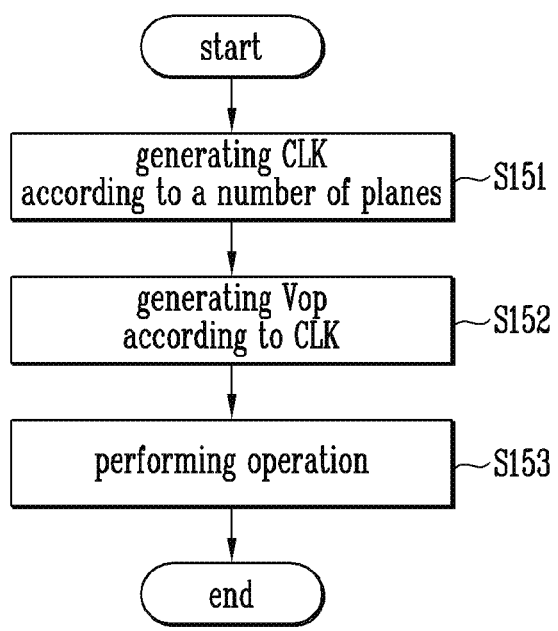
FIG. 15 is a flowchart for describing a voltage generation method according to another embodiment of the present disclosure.

FIG. 15 is a flowchart for describing a voltage generation method according to another embodiment of the present disclosure.

Referring to FIGS. 15 and 1, the voltage generator 130 may generate clocks CLK having various periods according to the number of planes selected during the program, read, or erase operation (S151). For example, the physical address is input when the program, read, or erase command is input to the memory device 1100. The logic circuit 170 may generate the operation code OPCD according to the command and the physical address. For example, the logic circuit 170 may generate the operation code OPCD including information such as the operation information and the physical address, and may transmit the operation code OPCD to the voltage generator 130. The operation code determiner 130*a* of FIG. 5 included in the voltage generator 130 may output the clock control code CLKCD according to the information included in the operation code OPCD, and the clock group 130*b* of FIG. 5 may adjust the period of the clocks CLK according to the clock control code CLKCD. The period of the clocks CLK may be set differently according to the number of selected planes. For example, the period of the clocks CLK may be set to be longer as the number of selected planes is decreased. In other words, the frequency of the clocks CLK may be set to be lower as the number of selected planes is decreased. Alternatively, the period of the clocks CLK may be set to be shorter as the number of selected planes is increased. In other words, the frequency of the clocks CLK may be set to be higher as the number of selected planes is increased.

The pump group 130*c* of FIG. 5 may generate the operation voltages Vop having various levels by driving the plurality of pumps according to the clocks CLK having the various periods (S152). As the period of the clocks CLK input to the pumps is longer, the driving force of the pumps is decreased, and thus the consumed current amount may be decreased.

The memory device 1100 may perform a selected operation on the selected memory block of the selected planes using the operation voltages Vop (S153). For example, the memory device 1100 may generate operation voltages Vop required for the read operation in response to the read RD command, and perform the read operation using the operation voltages Vop.

Figure 16A:
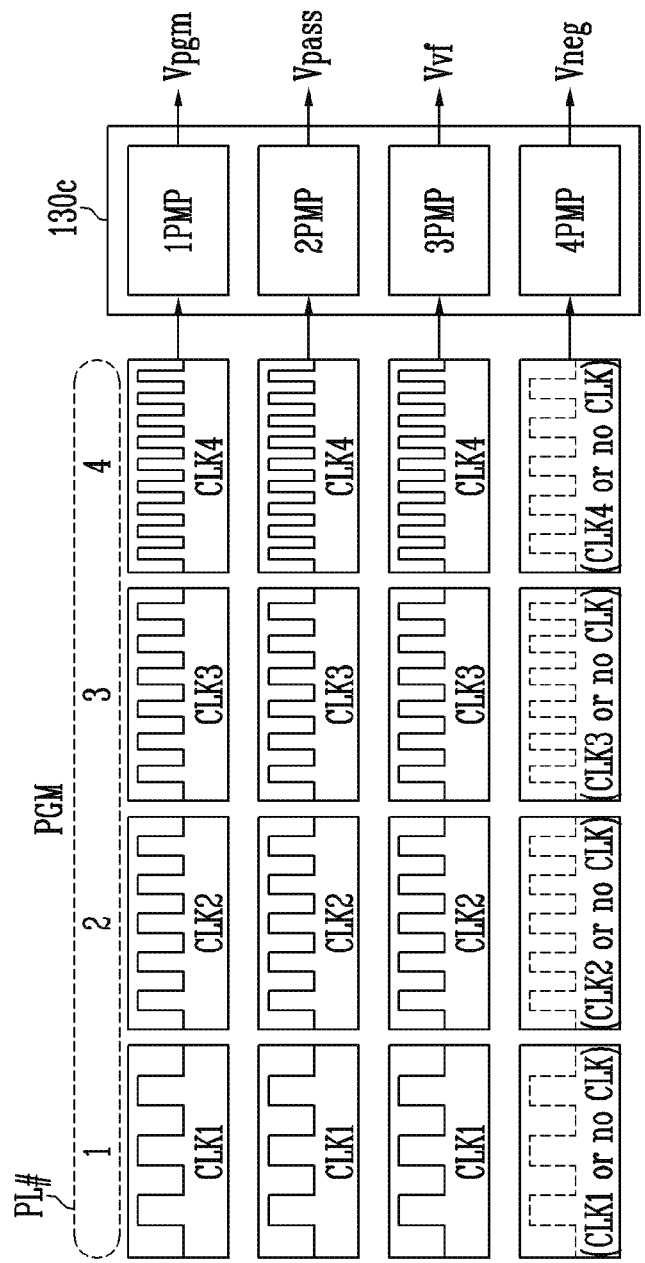
FIGS. 16A and 16B are diagrams for describing a method of generating voltages used in a program operation according to the voltage generation method shown in FIG. 15.
Figure 16B:
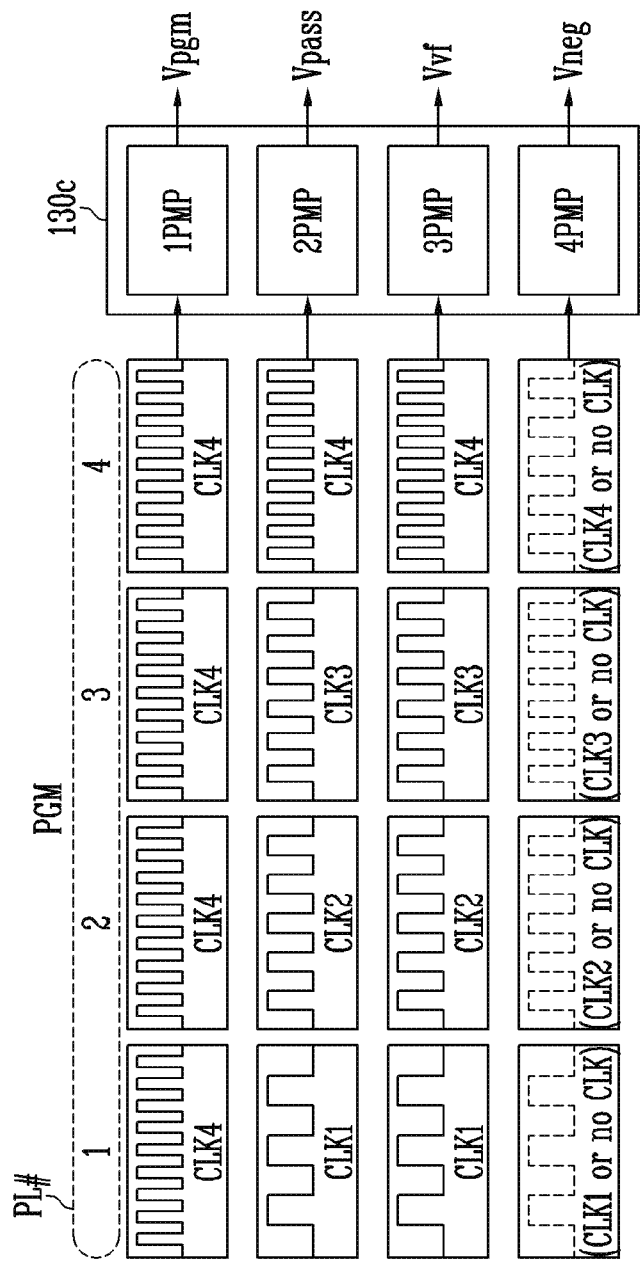

FIGS. 16A and 16B are diagrams for describing a method of generating voltages used in the program operation according to the voltage generation method shown in FIG. 15.

Referring to FIG. 16A, the period of the clock may be adjusted according to the number of selected planes PL# during the program operation PGM, and voltages required for the program operation may be generated according to the adjusted clock. For example, as the number of selected planes PL# increases, the period of the clocks applied to the first to fourth pumps 1 to 4PMP may be set to be short. The first pump 1PMP may be configured to generate the program voltage Vpgm, the second pump 2PMP may be configured to generate the pass voltage Vpass, the third pump 3PMP may be configured to generate the verify voltage Vvf, and the fourth pump 4PMP may be configured to generate the negative voltage Vneg.

When the number of selected planes PL# is one (1), the first to fourth pumps 1 to 4PMP may generate the program voltage Vpgm, the pass voltage Vpass, the verify voltage Vvf, and the negative voltage Vneg in response to the first clock CLK1 having the first period. Here, the negative voltage Vneg may be used when a verify voltage lower than 0V is required, and when the negative voltage Vneg is not used, a clock is not applied to the fourth pump 4PMP (no CLK), and thus the fourth pump 4PMP may be deactivated.

When the number of selected planes PL# is two (2), the first to fourth pumps 1 to 4PMP may generate the program voltage Vpgm, the pass voltage Vpass, the verify voltage Vvf, and the negative voltage Vneg in response to the second clock CLK2 having the second period shorter than the first period. In such a method, as the number of selected planes PL# increases, the voltages required for the program operation may be generated using a clock having a short period.

Referring to FIG. 16B, a period of a clock applied to some pumps may be adjusted according to the number of selected planes PL# during the program operation PGM, and a period of a clock applied to other pumps may be maintained to be constant even though the number of selected planes PL# changes. For example, as the number of selected planes PL# increases, the period of the clocks applied to the second to fourth pumps 2 to 4PMP may be set to be short, and the clock applied to the first pump 1PMP may be set to be maintained constantly. Since the first pump 1PMP generates the program voltage Vpgm, the first pump 1PMP may be configured to generate the program voltage Vpgm with high driving force. In order to have the high driving force, the period of the clock applied to the first pump 1PMP is required to be short, and thus the fourth clock CLK4 of which the period is the shortest may be applied to the first pump 1PMP.

Accordingly, the consumed current amount of the first pump 1PMP may increase, but when the number of selected planes PL# decreases, the period of the clocks applied to the remaining second to fourth pumps 2 to 4PMP is set to be long, and thus the consumed current amount of the second to fourth pumps 2 to 4 PMP may decrease.

Figure 17A:
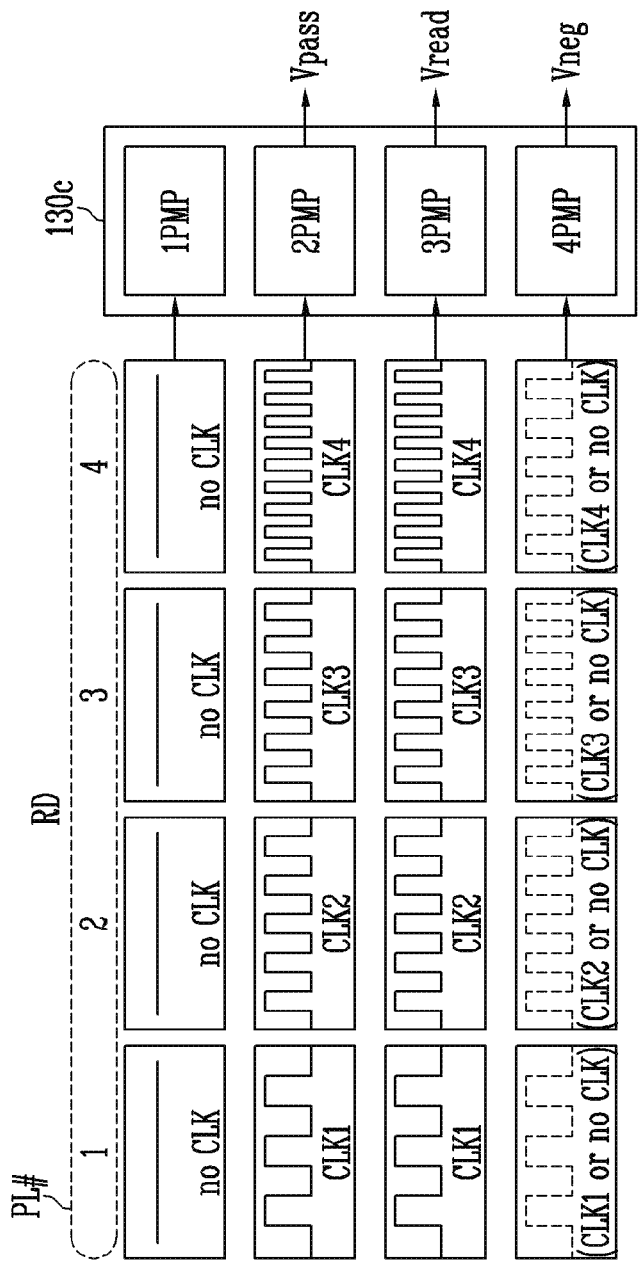
FIGS. 17A and 17B are diagrams for describing a method of generating voltages used in a read operation according to the voltage generation method shown in FIG. 15.
Figure 17B:
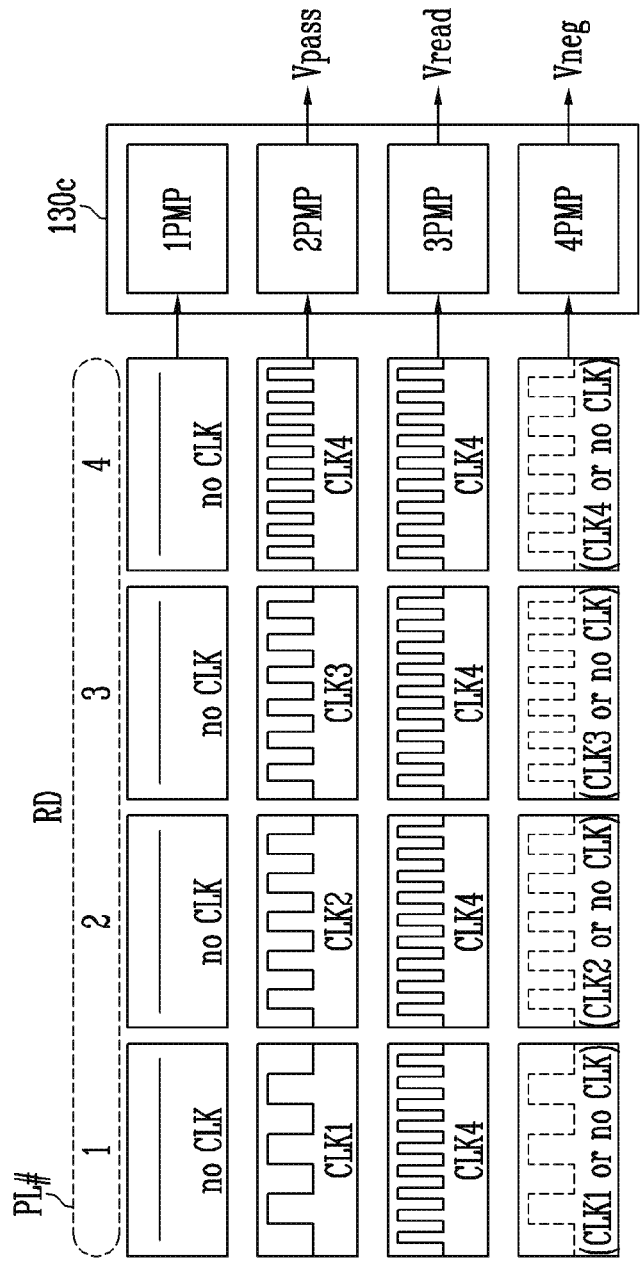

FIGS. 17A and 17B are diagrams for describing a method of generating voltages used in the read operation according to the voltage generation method shown in FIG. 15.

Referring to FIG. 17A, the period of the clock may be adjusted according to the number of selected planes PL# during the read operation RD, and voltages required for the read operation RD may be generated according to the adjusted clock. For example, as the number of selected planes PL# increases, the period of the clocks applied to the second to fourth pumps 2 to 4PMP may be set to be short. When the first pump 1PMP is configured to generate the program voltage or the erase voltage, the clock might not be applied to the first pump 1PMP in the read operation RD (no CLK). The second pump 2PMP may be configured to generate the pass voltage Vpass, the third pump 3PMP may be configured to generate the read voltage Vread, and the fourth pump 4PMP may be configured to generate the negative voltage Vneg.

When the number of selected planes PL# is one (1), the second to fourth pumps 2 to 4PMP may generate the pass voltage Vpass, the read voltage Vread, and the negative voltage Vneg in response to the first clock CLK1 having the first period. Here, the negative voltage Vneg may be used when a read voltage Vread lower than 0V is required, and when the negative voltage Vneg is not used, a clock is not applied to the fourth pump 4PMP (no CLK), and thus the fourth pump 4PMP may be deactivated.

When the number of selected planes PL# is two (2), the second to fourth pumps 2 to 4PMP may generate the pass voltage Vpass, the read voltage Vread, and the negative voltage Vneg in response to the second clock CLK2 having the second period shorter than the first period. In such a method, as the number of selected planes PL# increases, the voltages required for the read operation RD may be generated using a clock having a short period.

Referring to FIG. 17B, a period of a clock applied to some pumps may be adjusted according to the number of selected planes PL# during the read operation RD, and a period of a clock applied to other pumps may be maintained to be constant even though the number of selected planes PL# changes. For example, as the number of selected planes PL# increases, the period of the clocks applied to the second to fourth pumps 2 to 4PMP may be set to be short, and the clock applied to the third pump 3PMP may be set to be maintained constantly. Since the third pump 3PMP generates the read voltage Vread, the third pump 3PMP may be configured to generate the read voltage Vread using high driving force. In order to have the high driving force, the period of the clock applied to the third pump 3PMP is required to be short, and thus the fourth clock CLK4 of which the period is the shortest may be applied to the third pump 3PMP.

Accordingly, the consumed current amount of the third pump 3PMP may increase, but when the number of selected planes PL# decreases, the period of the clocks applied to the remaining second and fourth pumps 2PMP and 4PMP is set to be long, and thus the consumed current amount of the second and fourth pumps 2PMP and 4PMP may decrease.

Figure 18A:
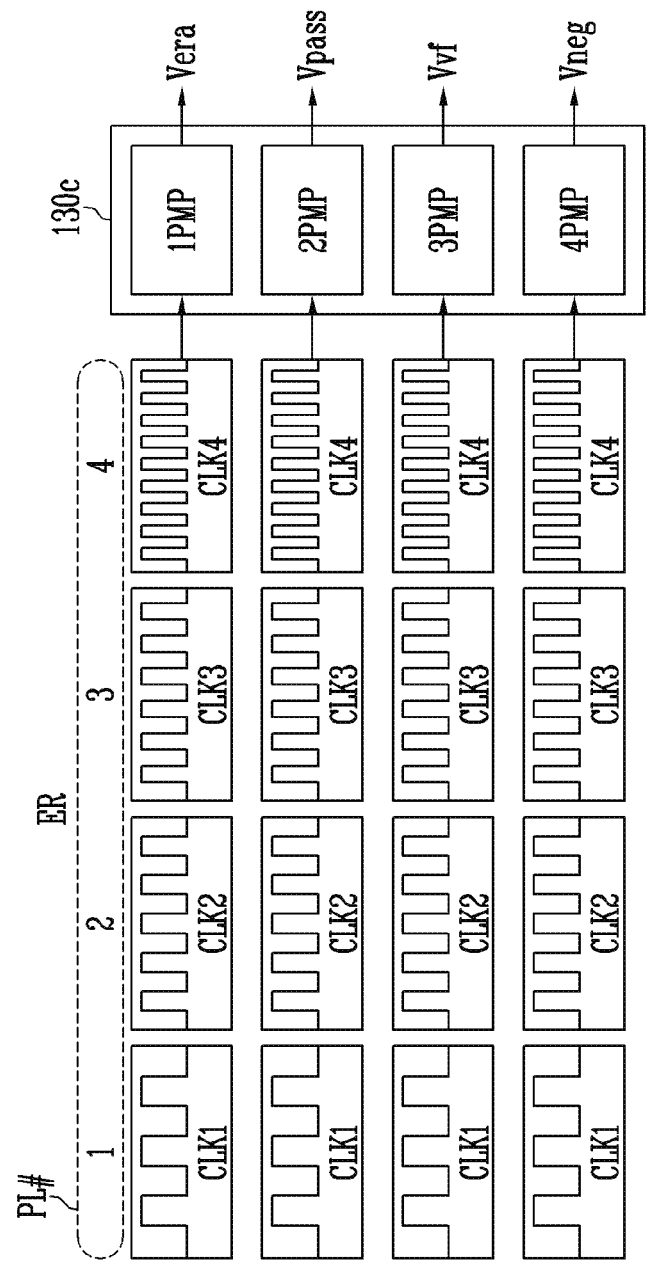
FIGS. 18A and 18B are diagrams for describing a method of generating voltages used in an erase operation according to the voltage generation method shown in FIG. 15.
Figure 18B:
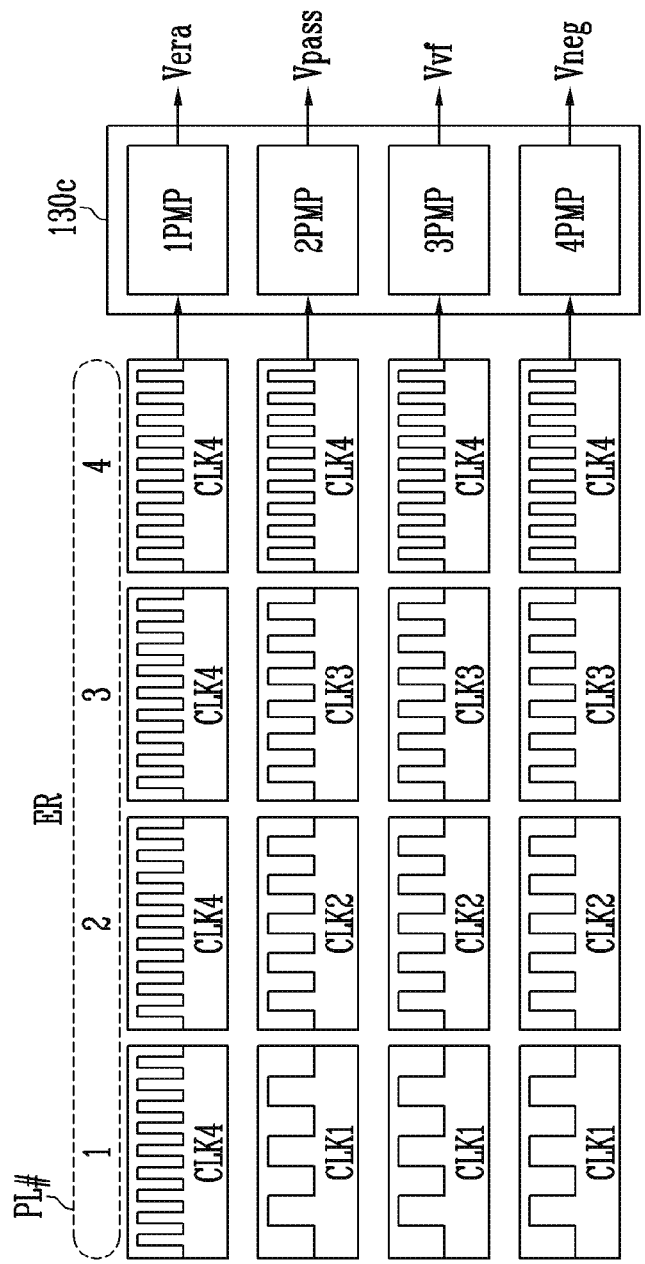

FIGS. 18A and 18B are diagrams for describing a method of generating voltages used in the erase operation according to the voltage generation method shown in FIG. 15.

Referring to FIG. 18A, the period of the clock may be adjusted according to the number of selected planes PL# during the erase operation ER, and voltages required for the erase operation ER may be generated according to the adjusted clock. For example, as the number of selected planes PL# increases, the period of the clocks applied to the first to fourth pumps 1 to 4PMP may be set to be short. The first pump 1PMP may be configured to generate the erase voltage Vera, the second pump 2PMP may be configured to generate the pass voltage Vpass, the third pump 3PMP may be configured to generate the verify voltage Vvf, and the fourth pump 4PMP may be configured to generate the negative voltage Vneg.

When the number of selected planes PL# is one (1), the first to fourth pumps 1 to 4PMP may generate the erase voltage Vera, the pass voltage Vpass, the verify voltage Vvf, and the negative voltage Vneg in response to the first clock CLK1 having the first period. Here, the negative voltage Vneg may be used when a verify voltage Vvf lower than 0V is required.

When the number of selected planes PL# is two (2), the first to fourth pumps 1 to 4PMP may generate the erase voltage Vera, the pass voltage Vpass, the verify voltage Vvf, and the negative voltage Vneg in response to the second clock CLK2 having the second period shorter than the first period. In such a method, as the number of selected planes PL# increases, the voltages required for the erase operation ER may be generated using a clock having a short period.

Referring to FIG. 18B, a period of a clock applied to some pumps may be adjusted according to the number of selected planes PL# during the erase operation ER, and a period of a clock applied to other pumps may be maintained to be constant even though the number of selected planes PL# changes. For example, as the number of selected planes PL# increases, the period of the clocks applied to the second to fourth pumps 2 to 4PMP may be set to be short, and the clock applied to the first pump 1PMP may be set to be maintained constantly. Since the first pump 1PMP generates the erase voltage Vera, the first pump 1PMP may be configured to generate the erase voltage Vera using high driving force. In order to have the high driving force, the period of the clock applied to the first pump 1PMP is required to be short, and thus the fourth clock CLK4 of which the period is the shortest may be applied to the first pump 1PMP.

Accordingly, the consumed current amount of the first pump 1PMP may increase, but when the number of selected planes PL# decreases, the period of the clocks applied to the remaining second to fourth pumps 2 to 4PMP is set to be long, and thus the consumed current amount of the second to fourth pumps 2 to 4PMP may decrease.

Figure 19:
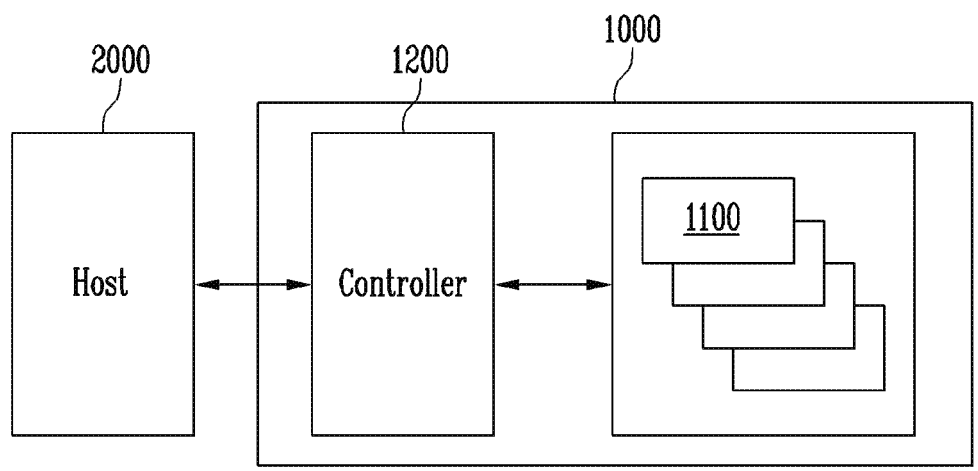
FIG. 19 is a diagram for describing an embodiment of a memory system including the memory device according to an embodiment of the present disclosure.

FIG. 19 is a diagram for describing an embodiment of a memory system including the memory device according to an embodiment of the present disclosure.

Referring to FIG. 19, the memory system 1000 may include the memory device 1100 in which data is stored, and the controller 1200 communicating between the memory device 1100 and the host 2000.

The memory system 1000 may include a plurality of memory devices 1100, and the memory devices 1100 may be connected to the controller 1200 through at least one channel. For example, a plurality of memory devices 1100 may be connected to one channel, and the plurality of memory devices 1100 may be connected to each channel even in a case where a plurality of channels are connected to the controller 1200.

The controller 1200 may communicate between the host 2000 and the memory device 1100. The controller 1200 may control the memory device 1100 according to a request of the host 2000 or may perform a background operation for performance improvement of the memory system 1000 even though there is no request from the host 2000.

The host 2000 may generate requests for various operations and output the generated requests to the memory system 1000. For example, the requests may include a program request that may control a program operation, a read request that may control a read operation, an erase request that may control an erase operation, and the like. The host 2000 may communicate with the memory system 1000 through various interfaces such as peripheral component interconnect express (PCIe), advanced technology attachment (ATA), serial ATA (SATA), parallel ATA (PATA), serial attached SCSI (SAS), non-volatile memory express (NVMe) a universal serial bus (USB), a multi-media card (MMC), an enhanced small disk interface (ESDI), or integrated drive electronics (IDE).

Figure 20:
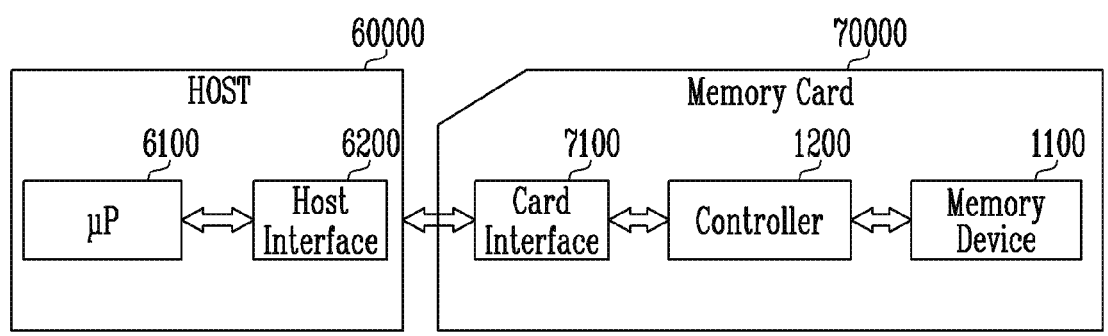
FIG. 20 is a diagram for describing another embodiment of a memory system including the memory device according to an embodiment of the disclosure.

FIG. 20 is a diagram for describing another embodiment of a memory system including the memory device according to an embodiment of the disclosure.

Referring to FIG. 20, the memory system 70000 may be implemented as a memory card or a smart card. The memory system 70000 may include the semiconductor memory device 1100, the controller 1200, and a card interface 7100.

The controller 1200 may control data exchange between the memory device 1100 and the card interface 7100. According to an embodiment, the card interface 7100 may be a secure digital (SD) card interface or a multi-media card (MMC) interface, but is not limited thereto.

The card interface 7100 may interface data exchange between a host 60000 and the controller 1200 according to a protocol of the host 60000. According to an embodiment, the card interface 7100 may support a universal serial bus (USB) protocol, and an inter chip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the memory device 1100 through the card interface 7100 and the controller 1200 under control of a microprocessor (μP) 6100.

What is claimed is:

1. A voltage generator comprising:
   an operation code determiner configured to output a clock control code including a number of selected memory planes in response to an operation code;
   a group of clock generators configured to simultaneously generate clocks having different periods according to the clock control code; and
   a group of pump circuits configured to perform a pumping operation according to the clocks and output operation voltages.

2. The voltage generator of claim 1, wherein the operation code is generated according to a command and an address.

3. The voltage generator of claim 2, wherein the group of pump circuits comprises:
   a plurality of pump circuits configured to output the operation voltages in response to the clocks; and
   a voltage output circuit configured to selectively transfer voltages output from the pump circuits to global word lines according to the address.

4. The voltage generator of claim 3, wherein the plurality of pump circuits comprises:
   a first pump circuit configured to output a one of program voltage and an erase voltage;
   a second pump circuit configured to output a pass voltage;

a third pump circuit configured to output one of a verify voltage and a read voltage; and a fourth pump circuit configured to output a negative voltage.

5. The voltage generator of claim 4, wherein the first to fourth pump circuits output, respectively, at least one of the program voltage and the erase voltage, the pass voltage, one of the verify voltage and the read voltage, and the negative voltage in response to the clocks output from the group of clock generators.

6. The voltage generator of claim 1, wherein the operation code includes operation information and a physical address of each of the selected memory planes.

7. The voltage generator of claim 3, wherein the operation information includes an operation to be performed according to a command, and the physical address includes an address of each of the selected memory planes.

8. The voltage generator of claim 6, wherein the operation code determiner comprises:
   a first register configured to store voltage information on voltages used in an operation selected according to the operation information; and
   a second register configured to store information corresponding with the number of selected memory planes determined according to memory plane addresses included in the physical address.

9. The voltage generator of claim 1, wherein the group of clock generators includes a plurality of clock generators configured to simultaneously output the clocks having different periods in response to the clock control code.

10. The voltage generator of claim 9, wherein the plurality of clock generators generate the clocks having different periods according to voltage information included in the clock control code and the number of selected memory planes.

11. The voltage generator of claim 10, wherein the plurality of clock generators change the periods of the docks according to at least one of the voltage information and the number of selected memory planes.

12. The voltage generator of claim 11, wherein the plurality of clock generators generate a clock having a longer period when at least one of the following occurs: an operation requires relatively low current demand and the number of the planes decreases.

13. The voltage generator of claim 11, wherein the plurality of clock generators generate a clock having a shorter period when at least one of the following occurs: an operation requires relatively high current demand and the number of selected memory planes increases.

14. A memory device comprising:
   a memory cell array including one or more planes, each including a plurality of memory blocks;
   a logic circuit configured to output an operation code for generating operation voltages required for an operation to be performed in a selected memory block in each of selected planes of the one or more planes according to a command and an address;
   a voltage generator configured to determine a number of selected planes, on which the operation is to be performed, according to a physical address included in the operation code, and adjust a driving force of pump circuits according to the number of selected planes to output the operation voltages; and
   a row decoder configured to transfer the operation voltages to a selected memory block among the memory blocks of a first plane of the selected planes.

15. The memory device of claim 14, further comprising:
   page buffers connected to the first plane through bit lines, the page buffers exchanging data with the selected memory block of the first plane according to a column address.

16. The memory device of claim 14, wherein the operation code includes information of the operation to be performed in the selected memory block according to the command and the physical address.

17. The memory device of claim 14, wherein the voltage generator comprises:
   an operation code determiner configured to output a clock control code including the number of selected planes in response to the operation code;
   a group of clock generators configured to simultaneously generate clocks having different periods according to the clock control code; and
   a group of pump circuits, each configured to have its driving force adjusted according to a respective one of the clocks and to output a respective one of the operation voltages.

18. The memory device of claim 17, wherein the operation code determiner comprises:
   a first register configured to store voltage information on voltages used in the operation; and
   a second register configured to store information corresponding with the number of selected planes determined according to memory plane addresses included in the physical address, and
   the operation code determiner outputs the clock control code including the voltage information and the number of selected planes.

19. The memory device of claim 18, wherein the group of clock generators includes a plurality of clock generators configured to simultaneously output the clocks having different periods in response to the clock control code, and
   the plurality of clock generators generate a clock having a longer period as the operation requires relatively low current demand or the number of the planes decreases, or generate a clock having a shorter period as the operation requires relatively high current demand or the number of the planes increases.

20. The memory device of claim 17, wherein the group of pump circuits comprises:
   a plurality of pump circuits configured to output the operation voltages in response to the clocks; and
   a voltage output circuit configured to transmit the operation voltages output from the plurality of pump circuits to global word lines connected to the row decoder according to the physical address.

* * * * *

UNITED STATES PATENT AND TRADEMARK OFFICE
CERTIFICATE OF CORRECTION

Page 1 of 1

PATENT NO.            : 11,205,486 B2
APPLICATION NO.       : 17/064261
DATED                 : December 21, 2021
INVENTOR(S)           : Won Jae Choi and Hyun Chul Cho It is certified that error appears in the above-identified patent and that said Letters Patent is hereby corrected as shown below:

In the Claims

Column 19, Lines 14-17, should read:
7. The voltage generator of claim 6, wherein the plurality of clock generators generate the clocks having different periods according to voltage information included in the clock control code and the number of selected memory planes.

Signed and Sealed this
Twelfth Day of April, 2022

Drew Hirshfeld
*Performing the Functions and Duties of the*
*Under Secretary of Commerce for Intellectual Property and*
*Director of the United States Patent and Trademark Office*